United States Patent
Yamada et al.

(10) Patent No.: US 8,193,614 B2
(45) Date of Patent: Jun. 5, 2012

(54) SEMICONDUCTOR DEVICE, MOISTURE-RESISTANT FRAME, GROOVE AND METHOD OF PRODUCING SEMICONDUCTOR DEVICE

(75) Inventors: Tomoyuki Yamada, Kawasaki (JP);
Fumio Ushida, Kawasaki (JP);
Shigetoshi Takeda, Kawasaki (JP);
Tomoharu Awaya, Kawasaki (JP); Koji Banno, Kawasaki (JP); Takayoshi Minami, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 234 days.

(21) Appl. No.: 12/053,903

(22) Filed: Mar. 24, 2008

(65) Prior Publication Data
US 2008/0230874 A1 Sep. 25, 2008

(30) Foreign Application Priority Data

Mar. 22, 2007 (JP) ................................ 2007-074424
Dec. 28, 2007 (JP) ................................ 2007-338951

(51) Int. Cl.
*H01L 23/544* (2006.01)
*H01L 23/48* (2006.01)
*H01L 23/52* (2006.01)
*H01L 29/40* (2006.01)

(52) U.S. Cl. ........ 257/620; 257/758; 257/773; 257/774; 257/E23.002

(58) Field of Classification Search .............. 257/620, 257/678, 758, 773, 774, E23.002; 438/458, 438/460, 462
See application file for complete search history.

(56) References Cited

U.S. PATENT DOCUMENTS

| | | | | |
|---|---|---|---|---|
| 6,100,118 | A * | 8/2000 | Shih et al. | 438/132 |
| 6,521,975 | B1 * | 2/2003 | West et al. | 257/620 |
| 6,566,735 | B1 | 5/2003 | Minn et al. | |
| 6,566,736 | B1 * | 5/2003 | Ogawa et al. | 257/620 |
| 6,614,120 | B2 * | 9/2003 | Sato et al. | 257/758 |
| 6,841,455 | B2 * | 1/2005 | West et al. | 438/462 |
| 6,998,712 | B2 * | 2/2006 | Okada et al. | 257/758 |
| 7,119,439 | B2 * | 10/2006 | Watanabe et al. | 257/751 |
| 7,224,069 | B2 * | 5/2007 | Chen | 257/774 |
| 7,241,676 | B2 * | 7/2007 | Watanabe et al. | 438/597 |
| 7,335,577 | B2 * | 2/2008 | Daubenspeck et al. | 438/462 |
| 7,456,507 | B2 * | 11/2008 | Yang | 257/797 |
| 7,521,336 | B2 * | 4/2009 | Daubenspeck et al. | 438/462 |
| 2002/0024115 | A1 * | 2/2002 | Ibnabdeljalil et al. | 257/620 |
| 2002/0043700 | A1 * | 4/2002 | Sasaki et al. | 257/620 |

(Continued)

FOREIGN PATENT DOCUMENTS

JP 2004-97917 A 4/2004

(Continued)

OTHER PUBLICATIONS

Korean Office Action dated Jul. 27, 2009, issued in corresponding Korean Patent Application No. 10-2008-0026245.

(Continued)

*Primary Examiner* — Teresa M Arroyo
(74) *Attorney, Agent, or Firm* — Westerman, Hattori, Daniels & Adrian, LLP

(57) ABSTRACT

A semiconductor device provided on a semiconductor substrate includes an element region including an element, a moisture-resistant frame surrounding the element region, an insulating layer provided between the moisture-resistant frame and an outer peripheral edge of the semiconductor device and on the semiconductor substrate, a first metal line extending along the outer peripheral edge and provided in the insulating layer, and a groove provided in the insulating layer.

11 Claims, 19 Drawing Sheets

U.S. PATENT DOCUMENTS

| | | | |
|---|---|---|---|
| 2003/0218254 A1* | 11/2003 | Kurimoto et al. | 257/758 |
| 2005/0087878 A1* | 4/2005 | Uesugi et al. | 257/758 |
| 2005/0269702 A1* | 12/2005 | Otsuka | 257/750 |
| 2005/0280120 A1* | 12/2005 | Tomita | 257/620 |
| 2006/0103025 A1* | 5/2006 | Furusawa et al. | 257/758 |
| 2006/0145347 A1* | 7/2006 | Aida | 257/758 |
| 2006/0190846 A1* | 8/2006 | Hichri et al. | 716/1 |
| 2007/0013011 A1* | 1/2007 | Yoshizawa et al. | 257/409 |
| 2007/0044057 A1* | 2/2007 | Kitani et al. | 716/8 |
| 2008/0017965 A1* | 1/2008 | Nomura et al. | 257/685 |
| 2008/0258266 A1* | 10/2008 | Takemura et al. | 257/620 |
| 2009/0079039 A1* | 3/2009 | Fujita et al. | 257/620 |
| 2009/0115024 A1* | 5/2009 | Jeng et al. | 257/620 |
| 2010/0006984 A1* | 1/2010 | Watanabe et al. | 257/639 |
| 2010/0133669 A1* | 6/2010 | Jao | 257/669 |

FOREIGN PATENT DOCUMENTS

| | | |
|---|---|---|
| JP | 2006-93407 A | 4/2006 |
| JP | 2006-140404 A | 6/2006 |
| KR | 2001-0048332 A | 6/2001 |

OTHER PUBLICATIONS

Taiwanese Office Action dated Oct. 26, 2011, issued in corresponding Taiwanese Patent Application No. 097106804 (English Translation).

* cited by examiner

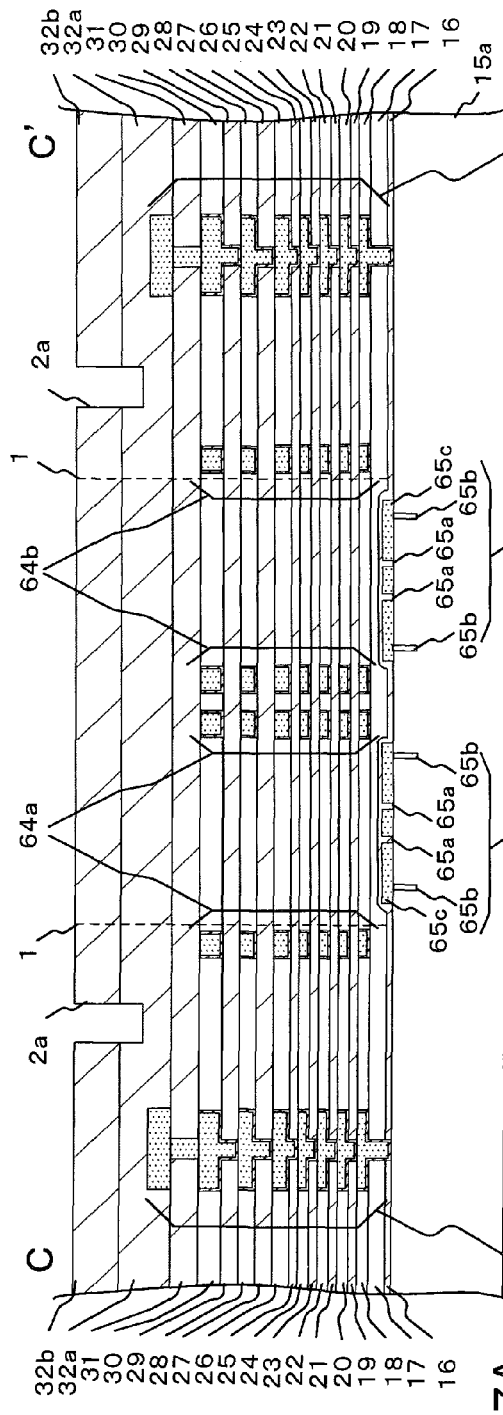
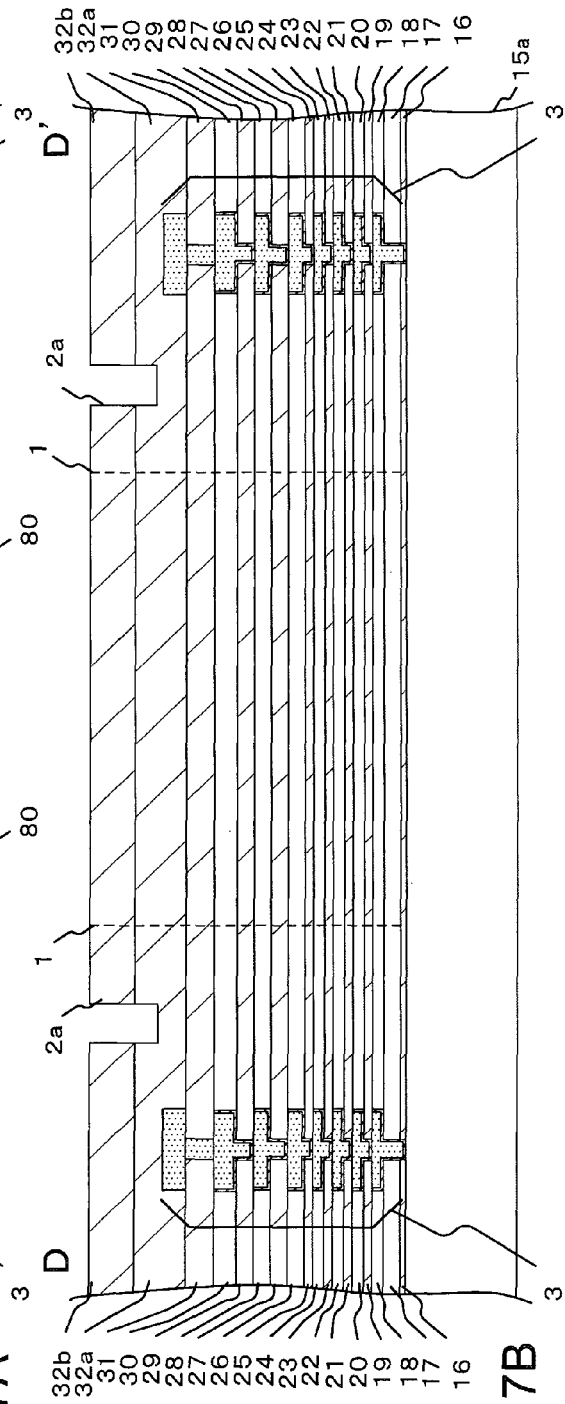
FIG.17A
FIG.17B

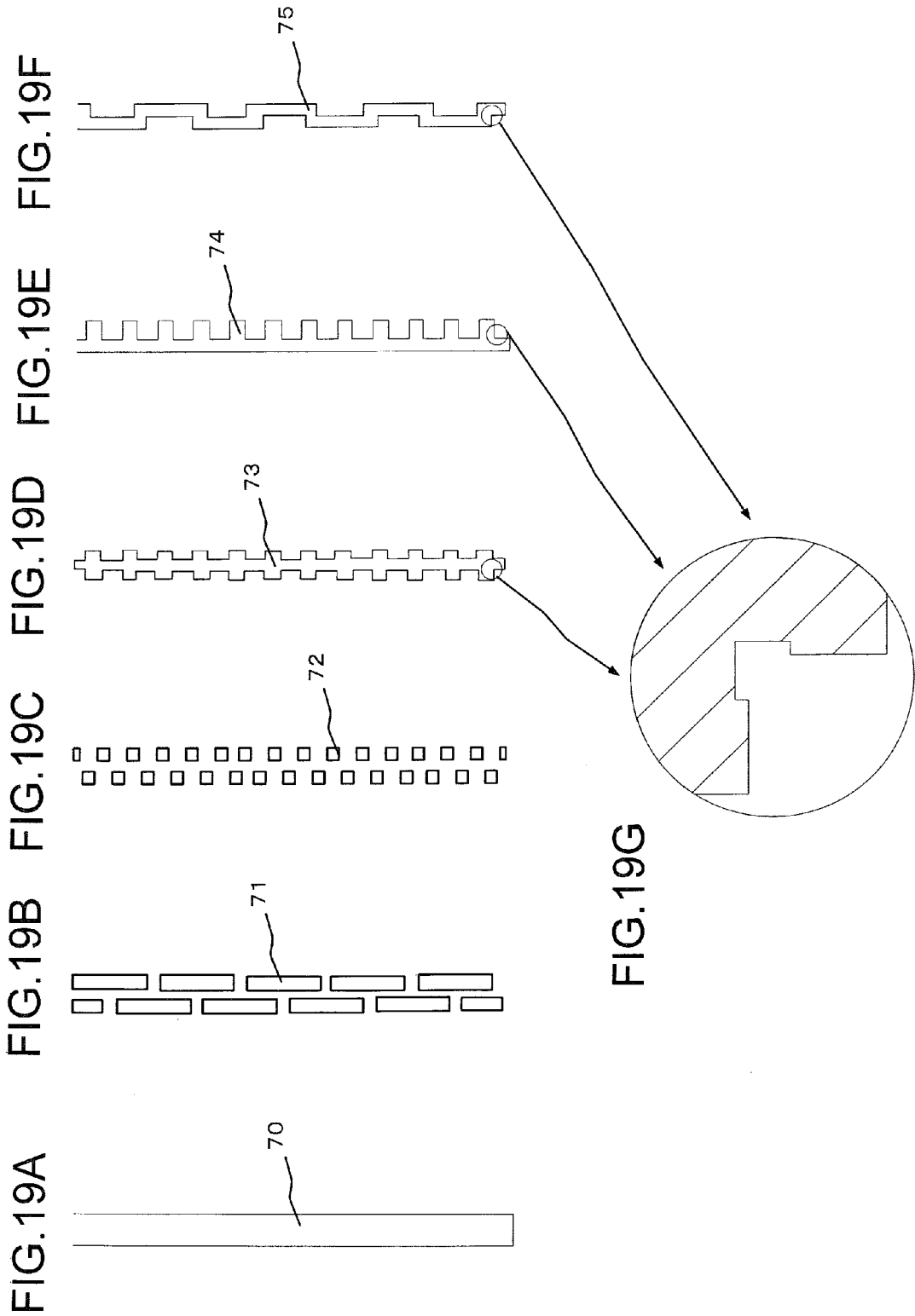

SEMICONDUCTOR DEVICE, MOISTURE-RESISTANT FRAME, GROOVE AND METHOD OF PRODUCING SEMICONDUCTOR DEVICE

TECHNICAL FILED

The embodiments relate to a semiconductor device and a method of producing the same.

BACKGROUND

In the formation of semiconductor devices on a wafer, the number of effective chips is determined by the area of the semiconductor devices and the area of scribe line regions. Consequently, it has been desired that the number of effective chips per wafer be increased by reducing the area of the scribe line regions.

The scribe line regions are regions required for separating a plurality of semiconductor devices formed on a wafer into chips by laser cutting or cutting with a dicing saw.

Semiconductor devices each include a circuit pattern region and an outer peripheral region for absorbing cracks formed when the semiconductor devices are separated from each other, the outer peripheral region being adjacent to the circuit pattern region and a scribe line region. The outer peripheral region for absorbing cracks due to a chip cutting extends from an edge of the scribe line region to a moisture-resistant frame-shaped shield disposed within the chip. The moisture-resistant frame-shaped shield is disposed at the boundary between the circuit pattern region and the outer peripheral region. The moisture-resistant frame-shaped shield is provided in order to prevent moisture from entering the inside of the semiconductor device from the cut surfaces after the plurality of semiconductor devices formed on the wafer are separated from each other.

According to a known technique for reducing the outer peripheral region that absorbs cracks, a groove for preventing propagation of cracks is provided on a cover film provided as an uppermost layer of a semiconductor device at a position between an edge of a scribe line region and a moisture-resistant frame-shaped shield (see, for example, Japanese Laid-open Patent Application Publication No. 9-199449). According to another technique, a groove extending from the top of a semiconductor device to a substrate is formed at a position between an edge of a scribe line region and a moisture-resistant frame-shaped shield, and the groove is then filled with a metal material (see, for example, Japanese Unexamined Patent Application Publication No. 10-41408).

SUMMARY

An aspect of the embodiments provides a semiconductor device provided on a semiconductor substrate including an element region including an element, a moisture-resistant frame surrounding the element region, an insulating layer provided between the moisture-resistant frame and an outer peripheral edge of the semiconductor device and over the semiconductor substrate, a first metal line extending along the outer peripheral edge and provided in the insulating layer, and a groove provided in the insulating layer.

BRIEF DESCRIPTION OF THE DRAWINGS

FIG. 17A is a cross-sectional view taken along line C-C' in FIG. 16;

FIG. 17B is a cross-sectional view taken along line D-D' in FIG. 16;

FIGS. 19A to 19F each show a planar shape of a metal pattern constituting a metal line; and FIG. 19G is a view showing a part of the shape of a mask pattern of a mask used for forming a basic metal line.

DESCRIPTION OF THE PREFERRED EMBODIMENTS

A first embodiment, a second embodiment, a third embodiment, a fourth embodiment, a fifth embodiment, a sixth embodiment, a seventh embodiment, and an eighth embodiment will now be described. The present invention is not limited to these embodiments.

First Embodiment

A first embodiment relates to a semiconductor device including, in an outer peripheral region disposed between an element region in which a semiconductor element is provided and a scribe region, a metal line embedded in grooves which are provided in insulating layers so as to surround the element region, and in the outer peripheral region, a groove provided in an uppermost insulating film on the metal line.

The first embodiment will now be described with reference to FIGS. 1 to 6.

Figure 1:
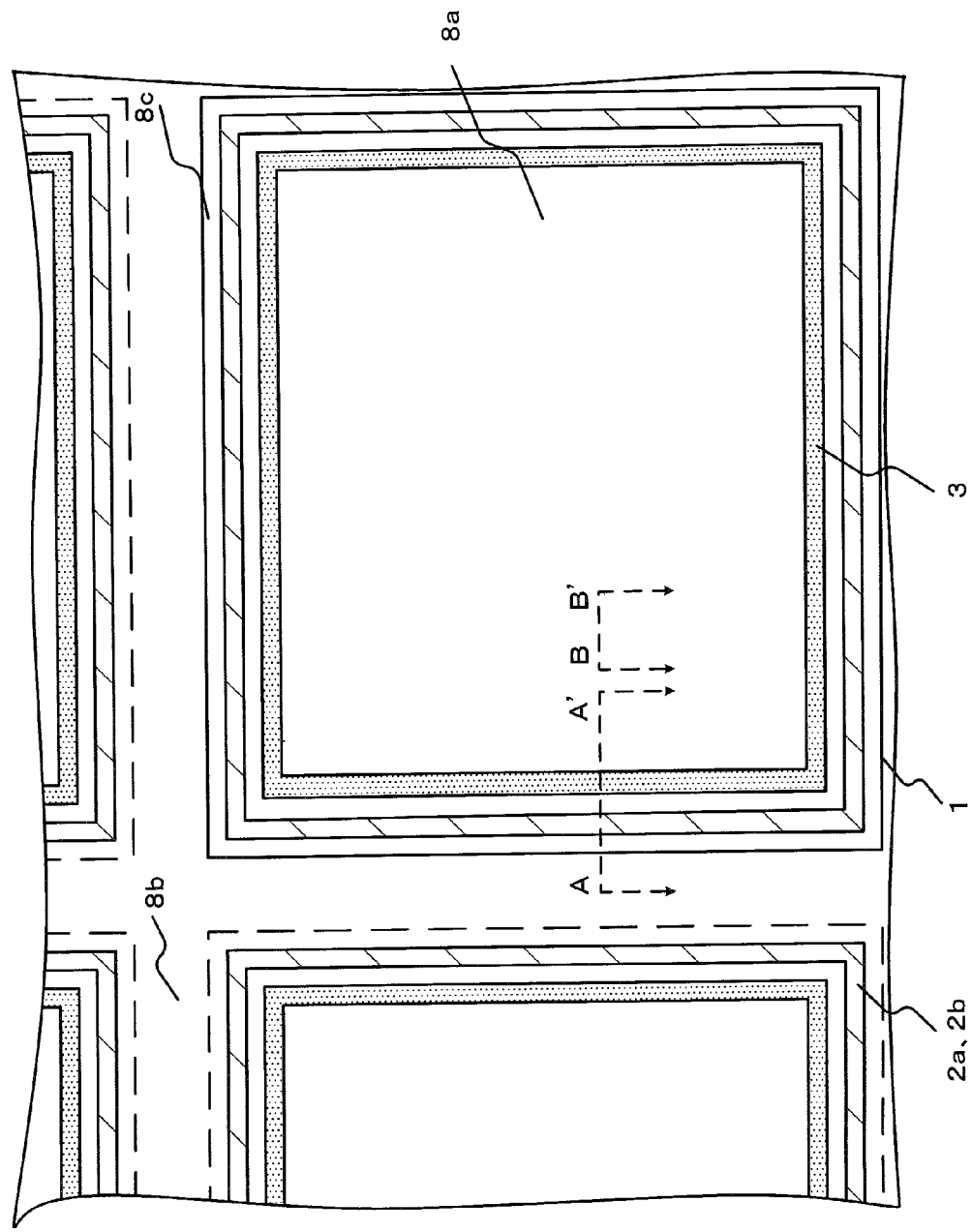
FIG. 1 is a plan view showing a semiconductor device of a first embodiment.

FIG. 1 is a plan view showing a semiconductor device of the first embodiment. FIG. 1 shows a scribe edge 1, an opening 2a, a metal line 2b, a moisture-resistant frame-shaped shield 3, an element region 8a, a scribe region 8b, and an outer peripheral region 8c.

The element region 8a is a region where a pattern of semiconductor circuits is formed in the semiconductor device.

The scribe region 8b is a region to be cut when semiconductor devices formed on a wafer are separated from each other.

The outer peripheral region 8c is a region that is located between the scribe region 8b and the element region 8a and that is disposed so as to surround the element region 8a in the semiconductor device.

The scribe edge 1 is a boundary between the scribe region 8b and the semiconductor device. More specifically, the scribe edge 1 is a boundary between the scribe region 8b and the outer peripheral region 8c.

The opening 2a is a groove-shaped opening provided in an uppermost insulating film included in the semiconductor device. The opening 2a is disposed in the outer peripheral region 8c so as to surround the element region 8a in the form of a frame. The opening 2a is disposed at a position where the opening 2a two-dimensionally overlaps with the metal line 2b described below.

The opening 2a prevents detachment or a crack of the uppermost insulating film, which is generated when the semiconductor device is cut with a laser beam or a saw of a dicing machine in the scribe region 8b, from extending into the element region 8a.

The reason for this is believed to be as follows. Since the opening 2a is provided in the uppermost insulating film in the form of a groove, propagation of a crack in the uppermost insulating film from the side of the scribe region 8b can be stopped.

The metal line 2b is made of the same metal material as wirings included in the semiconductor device. As described below, the metal line 2b is formed by filling grooves, which are provided in insulating layers so as to surround the element region 8a, with the metal material. The insulating layers are insulating layers that separate wiring layers in the semiconductor device.

Here, as described below, the metal line 2b prevents propagation of cracks in the insulating layers propagating from the side of the scribe region 8b into the element region 8a. Insulating materials, which do not have elasticity, are easily broken when stress is applied thereto. In contrast, since metal materials have elasticity, a large amount of stress is required for breaking. Accordingly, it is believed that when a metal material is filled in the grooves in the insulating layers, propagation of cracks in the insulating layers can be prevented.

The moisture-resistant frame-shaped shield 3 is made of the same metal material as wirings included in the semiconductor device. The moisture-resistant frame-shaped shield 3 is disposed at the boundary between the element region 8a and the outer peripheral region 8c so as to surround the element region 8a. As described below, the moisture-resistant frame-shaped shield 3 is composed of all wiring layers included the semiconductor device. All wirings constituting the moisture-resistant frame-shaped shield 3 are connected by metal plugs that are provided between the wirings so as to connect upper and lower wirings and that are embedded in the grooves. As described below, the term "metal plug" mainly refers to a whole metal material embedded in a contact window, but also refers to a whole metal material embedded in a groove.

The moisture-resistant frame-shaped shield 3 prevents intrusion of moisture from the scribe region 8b to the element region 8a after the semiconductor devices are separated from each other by cutting. This is because the moisture-resistant frame-shaped shield 3 has a metal wall-like shape surrounding the element region 8a. It is also believed that intrusion of moisture into the element region 8a can be prevented because the metal material constituting the moisture-resistant frame-shaped shield 3 reacts with moisture, and thus the moisture remains in the area of the metal material.

Figure 2:
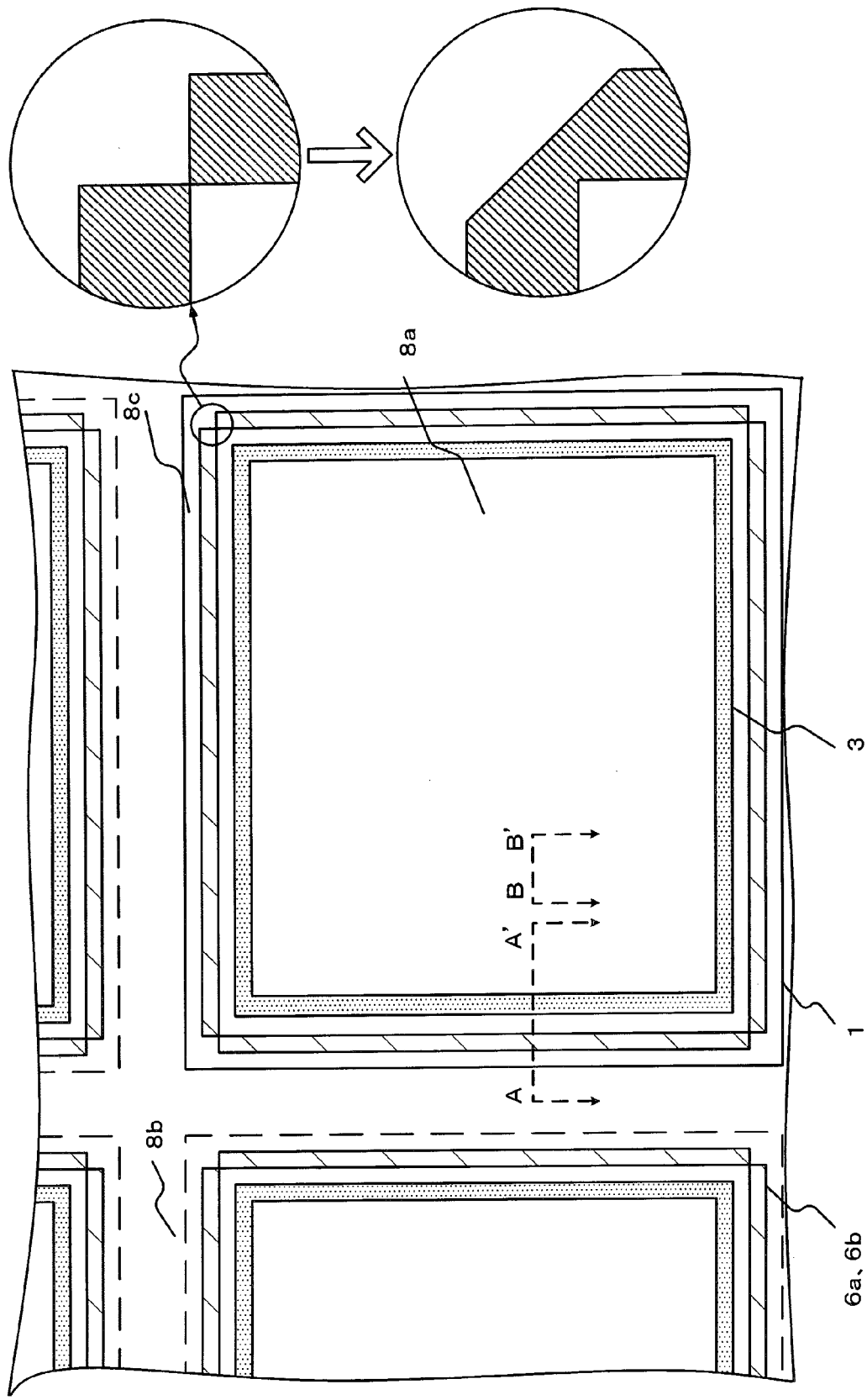
FIG. 2 is a plan view showing a modification of the semiconductor device of the first embodiment.
Figure 3:
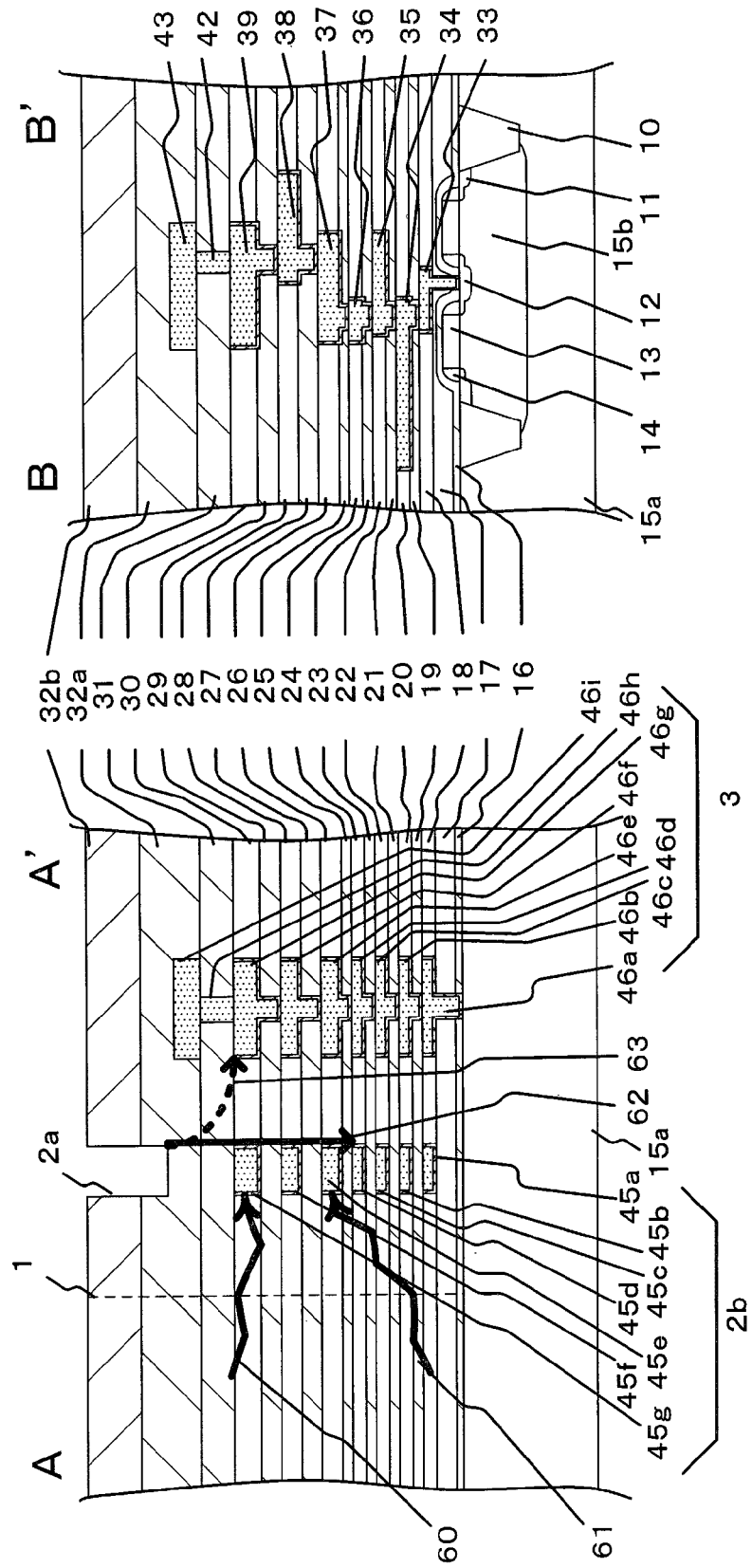
FIGS. 3A and 3B are cross-sectional views of the semiconductor device of the first embodiment and show an advantage of a metal line 2b in the first embodiment.

FIG. 2 is a plan view showing a modification of the semiconductor device of the first embodiment. FIG. 2 shows a scribe edge 1, a C-window shield 6a, a metal line 6b, a moisture-resistant frame-shaped shield 3, an element region 8a, a scribe region 8b, and an outer peripheral region 8c. The same components as those shown in FIG. 1 are assigned the same reference numerals. Specifically, the scribe edge 1, the moisture-resistant frame-shaped shield 3, the element region 8a, the scribe region 8b, and the outer peripheral region 8c are the same as those shown in FIG. 1.

The C-window shield 6a is disposed in the outer peripheral region 8c and is an opening provided in an uppermost insulating film included in the semiconductor device. The C-window shield 6a is composed of four rectangular grooves each having the same length as that of an edge of the element region 8a. The four grooves are arranged so as to surround the element region 8a. However, the four grooves are discontinuous at four corners of the element region 8a. In addition, the four grooves are disposed at positions where the four grooves two-dimensionally overlap with the metal line 6b described below. The C-window shield 6a has the same function as that of the opening 2a.

The metal line 6b is made of the same metal material as wirings included in the semiconductor device. As described below, the metal line 6b is formed by filling the four rectangular grooves, which are provided in insulating layers so as to surround the element region 8a, with the metal material. Specifically, the four grooves do not form a frame shape but are discontinuous at the four corners of the element region 8a. The insulating layers are insulating layers that separate wiring layers in the semiconductor device. An advantage of the presence of the metal line 6b is the same as that of the metal line 2b described above.

The enlarged view indicated by the thin line arrow shows a corner of the element region 8a. The structure of this modification can prevent stress between each of the insulating layers and the metal material, which is generated when the metal material is elongated by thermal expansion, from being accumulated between grooves having the metal material therein. The reason for this is as follows. The above-mentioned metal line 2b has a planar shape in which the angle is 90 degrees at corners. Therefore, stress is concentrated on the corners. In contrast, regarding the metal line 6b, in a direction in which stress is applied, each of the insulating layers and the metal material are in contact with each other in an edge of the groove having the metal therein. As a result, the stress can be dispersed.

In addition, as shown in another enlarged view indicated by the thick arrow, by chamfering the corners of the metal line 2b, stress can be similarly dispersed at the corners of the metal line 2b. This is because, in a direction in which stress is applied, similarly, each of the insulating layers and the metal material are in contact with each other in a chamfered edge.

FIGS. 3A and 3B are cross-sectional views of a semiconductor device of the first embodiment and show an advantage of the metal line 2b in the first embodiment. FIG. 3A is a cross-sectional view showing an A-A' cross section of FIG. 1 and FIG. 2. FIG. 3B is a cross-sectional view showing a B-B' cross section of FIG. 1 and FIG. 2.

FIGS. 3A and 3B show a scribe edge 1, an opening 2a, a metal line 2b, a moisture-resistant frame-shaped shield 3, a shallow trench isolation (STI) 10, a source region 11 of a MOS transistor, a drain region 12 of the MOS transistor, a gate electrode 13 of the MOS transistor, side walls 14, a substrate 15a, a well 15b, an insulating film 16, a contact interlayer film 17, a contact interlayer film 18, wiring interlayer films 19, 20, 21, 22, 23, 24, 25, 26, 27, 28, 29, 30, and 31, cover films 32a and 32b, wiring-and-plugs 33, 34, 35, 36, 37, 38, and 39, a plug 42, a wiring 43, wirings 45a, 45b, 45c, 45d, 45e, 45f, and 45g, wiring-and-plugs 46a, 46b, 46c, 46d, 46e, 46f, and 46g, a plug 46h, a wiring 46i, and arrows 60, 61, 62, and 63.

The scribe edge 1, the opening 2a, the metal line 2b, and the moisture-resistant frame-shaped shield 3 are the same as the scribe edge 1, the opening 2a, the metal line 2b, and the moisture-resistant frame-shaped shield 3 described with reference to FIG. 1.

The B-B' cross section, which relates to the element region 8a, will now be described with reference to FIG. 3B. FIG. 3B shows a bulk portion including a MOS transistor and the like, a lower-layer wiring portion, an intermediate-layer wiring portion, an upper-layer wiring portion, an uppermost-layer wiring portion, and a cover film portion.

The bulk portion includes the substrate 15a, the well 15b, the STI 10, the MOS transistor, and the insulating film 16.

The substrate 15a is a semiconductor substrate on which semiconductor elements are formed and has a predetermined conductivity type. The STI 10 is an element isolation that electrically isolates the semiconductor elements. The STI 10 is composed of a groove provided between semiconductor elements and an insulating material filling the groove. The well 15b is an impurity region provided from the surface of the substrate 15a toward the inside of the substrate 15a. An impurity of a conductivity type opposite to that of the MOS transistor formed in the well 15b is diffused in the well 15b.

The source region 11 of the MOS transistor is a region forming a source electrode of the MOS transistor, and is an impurity diffusion region in which an impurity of a conductivity type different from the conductivity type of the substrate 15a is introduced in the substrate 15a. The drain region 12 of the MOS transistor is a region forming a drain electrode of the MOS transistor, and is an impurity diffusion region similar to the source region 11. The gate electrode 13 of the MOS transistor is disposed on a gate oxide film provided on the surface of the substrate 15a. The gate electrode 13 is made of, for example, polysilicon, a silicide, a metal, or the like. The drain region 12 and the source region 11 are disposed at both sides of the gate electrode 13 of the MOS transistor. The side walls 14 are provided on the sidewalls of the gate electrode 13 and are composed of, for example, a silicon oxide film. The insulating film 16 is an insulating film provided on the MOS transistor and is composed of, for example, a silicon oxide film.

The lower-layer wiring portion includes the contact interlayer films 17 and 18, and four layer units disposed on the contact interlayer films, each of the layer units being composed of a wiring layer and an interlayer film of the wiring layer.

The contact interlayer films 17 and 18 are sequentially stacked on the insulating film 16. The contact interlayer films 17 and 18 are insulating films provided between the MOS transistor and a wiring for being electrically in contact with the MOS transistor. The wiring-and-plug 33 is composed of a wiring that is embedded in a groove in the contact interlayer film 18 and is electrically in contact with the MOS transistor, and a contact plug embedded in a via in the contact interlayer film 17. Note that the term "via" refers to an opening provided so as to penetrate through an insulating film. The term "contact plug" refers to a rod-like metal block that is connected to wirings at the top and the bottom thereof so as to electrically connect the upper wiring to the lower wiring. The wirings and the contact plug are made of a metal material such as copper, or copper and tantalum or tantalum nitride that is provided at the boundary between copper and an insulating film. Copper is a main component of the wirings. Tantalum or tantalum nitride functions as a diffusion-preventing film that prevents copper from diffusing in the insulating film.

The wiring interlayer films 19 and 20, which are sequentially stacked on the contact interlayer film 18, are insulating films provided between wirings. The wiring-and-plug 34 is composed of a wiring embedded in a groove in the wiring interlayer film 20 and a contact plug embedded in a via in the wiring interlayer film 19. These wiring and contact plug have the same structures as those described above.

The wiring interlayer films 21 and 22, which are sequentially stacked on the wiring interlayer film 20, are insulating films provided between wirings. The wiring-and-plug 35 is composed of a wiring embedded in a groove in the wiring interlayer film 22 and a contact plug embedded in a via in the wiring interlayer film 21. These wiring and contact plug have the same structures as those described above.

The wiring interlayer films 23 and 24, which are sequentially stacked on the wiring interlayer film 22, are insulating films provided between wirings. The wiring-and-plug 36 is composed of a wiring embedded in a groove in the wiring interlayer film 24 and a contact plug embedded in a via in the wiring interlayer film 23. These wiring and contact plug have the same structures as those described above.

The intermediate-layer wiring portion includes the wiring interlayer films 25 and 26, and two layer units disposed on the wiring interlayer films, each of the layer units being composed of a wiring layer and an interlayer film of the wiring layer.

The wiring interlayer films 25 and 26, which are sequentially stacked on the wiring interlayer film 24, are insulating films provided between wirings. The wiring-and-plug 37 is composed of a wiring embedded in a groove in the wiring interlayer film 26 and a contact plug embedded in a via in the wiring interlayer film 25. These wiring and contact plug have the same structures as those described above.

The wiring interlayer films 27 and 28, which are sequentially stacked on the wiring interlayer film 26, are insulating films provided between wirings. The wiring-and-plug 38 is composed of a wiring embedded in a groove in the wiring interlayer film 28 and a contact plug embedded in a via in the wiring interlayer film 27. These wiring and contact plug have the same structures as those described above.

The upper-layer wiring portion includes the wiring interlayer films 29 and 30 and a wiring layer disposed on the wiring interlayer films.

The wiring interlayer films 29 and 30, which are sequentially stacked on the wiring interlayer film 28, are insulating films provided between wirings. The wiring-and-plug 39 is composed of a wiring embedded in a groove in the wiring interlayer film 30 and a contact plug embedded in a via in the wiring interlayer film 29. These wiring and contact plug have the same structures as those described above.

The uppermost-layer wiring portion includes the wiring interlayer film 31, the plug 42, and the wiring 43 composed of a wiring layer disposed on the wiring interlayer film 31 and the plug 42.

The wiring interlayer film 31, which is stacked on the wiring interlayer film 30, is an insulating film provided between wirings. The plug 42 is composed of a contact plug embedded in a via in the wiring interlayer film 31. The contact plug of the plug 42 may be made of copper the surface of which is covered with titanium nitride. Alternatively, this contact plug may be made of tungsten.

The wiring 43 is an uppermost wiring provided on the wiring interlayer film 31. The wiring 43 is made of copper or aluminum. When the wiring 43 is made of aluminum as shown in the figure, the wiring 43 is formed by etching using a resist patterned by photolithography as a mask.

Although not shown in the figure, when the wiring 43 is made of copper, the wiring 43 is formed by forming a groove in the cover film 32a and then embedding copper in the groove.

The cover film portion includes the cover film 32a and the cover film 32b. The cover film 32a is an insulating film stacked on the wiring 43. The cover film 32b is an uppermost insulating film stacked on the cover film 32a.

The A-A' cross section, which relates to the portion ranging from the scribe region 8b to the moisture-resistant frame-shaped shield 3, will now be described with reference to FIG. 3A. FIG. 3A shows the scribe edge 1, the metal line 2b, the opening 2a, and the moisture-resistant frame-shaped shield 3.

The moisture-resistant frame-shaped shield 3 is composed of wiring-and-plugs 46a, 46b, 46c, 46d, 46e, 46f, and 46g, the plug 46h, and the wiring 46i.

The wiring-and-plug 46a is composed of a wiring embedded in a groove in the contact interlayer film 18 and a contact plug embedded in a via in the contact interlayer film 17. The above via includes not only a normal rectangular via used in the element region 8a but also a groove-shaped via. The wiring-and-plug 46a is connected to the substrate 15a. The wiring-and-plug 46a is made of, for example, copper covered with tantalum or tantalum nitride. Tantalum or tantalum nitride functions as a diffusion-preventing film that prevents copper from diffusing in the contact interlayer films 17 and 18.

The wiring-and-plug 46b is composed of a wiring embedded in a groove in the wiring interlayer film 20 and a contact plug embedded in a via in the wiring interlayer film 19. The wiring-and-plug 46b is connected to the wiring-and-plug 46a. The wiring-and-plug 46b is also formed by a dual damascene process as in the above-mentioned wiring-and-plug.

The wiring-and-plug 46c is composed of a wiring embedded in a groove in the wiring interlayer film 22 and a contact plug embedded in a via in the wiring interlayer film 21. The wiring-and-plug 46c is connected to the wiring-and-plug 46b. The wiring-and-plug 46c is also formed by a dual damascene process as in the above-mentioned wiring-and-plug.

The wiring-and-plug 46d is composed of a wiring embedded in a groove in the wiring interlayer film 24 and a contact plug embedded in a via in the wiring interlayer film 23. The wiring-and-plug 46d is connected to the wiring-and-plug 46c. The wiring-and-plug 46d is also formed by a dual damascene process as in the above-mentioned wiring-and-plug.

The wiring-and-plug 46e is composed of a wiring embedded in a groove in the wiring interlayer film 26 and a contact plug embedded in a via in the wiring interlayer film 25. The wiring-and-plug 46e is connected to the wiring-and-plug 46d.

The wiring-and-plug 46e is also formed by a dual damascene process as in the above-mentioned wiring-and-plug.

The wiring-and-plug 46f is composed of a wiring embedded in a groove in the wiring interlayer film 28 and a contact plug embedded in a via in the wiring interlayer film 27. The wiring-and-plug 46f is connected to the wiring-and-plug 46e. The wiring-and-plug 46f is also formed by a dual damascene process as in the above-mentioned wiring-and-plug.

The wiring-and-plug 46g is composed of a wiring embedded in a groove in the wiring interlayer film 30 and a contact plug embedded in a via in the wiring interlayer film 29. The wiring-and-plug 46g is connected to the wiring-and-plug 46f. The wiring-and-plug 46g is also formed by a dual damascene process as in the above-mentioned wiring-and-plug.

The plug 46h is a contact plug embedded in a via in the wiring interlayer film 31. The wiring-and-plug 46h is connected to the wiring-and-plug 46g. This contact plug may be made of copper covered with tantalum or tantalum nitride. Alternatively, this contact plug may be made of tungsten.

The wiring 46i is a wiring provided on the wiring interlayer film 31. The wiring 46i is connected to the plug 46h. The wiring 46i is made of copper or aluminum. When the wiring 46i is made of aluminum as shown in the figure, the wiring 46i is formed by etching using a resist patterned by photolithography as a mask. Although not shown in the figure, when the wiring 46i is made of copper, the wiring 46i is formed by forming a groove in the cover film 32a and then embedding copper in the groove.

The metal line 2b is composed of the wirings 45a, 45b, 45c, 45d, 45e, 45f, and 45g. The wirings constituting the metal line 2b do not include a wiring disposed at a position corresponding to the plug 46h and the wiring 46i forming the moisture-resistant frame-shaped shield 3. This is because it is necessary to ensure a certain amount of the depth of a groove of the opening 2a described below.

The wiring 45a is made of a metal material embedded in a groove in the contact interlayer film 18. The metal material is copper covered with tantalum or tantalum nitride. Tantalum or tantalum nitride functions as a diffusion-preventing film that prevents copper from diffusing in the contact interlayer film 18.

The wiring 45b is composed of a wiring embedded in a groove in the wiring interlayer film 20. The wiring 45b is also formed by a damascene process as in the above-mentioned wiring.

The wiring 45c is composed of a wiring embedded in a groove in the wiring interlayer film 22. The wiring 45c is also formed by a damascene process as in the above-mentioned wiring.

The wiring 45d is composed of a wiring embedded in a groove in the wiring interlayer film 24. The wiring 45d is also formed by a damascene process as in the above-mentioned wiring.

The wiring 45e is composed of a wiring embedded in a groove in the wiring interlayer film 26. The wiring 45e is also formed by a damascene process as in the above-mentioned wiring.

The wiring 45f is composed of a wiring embedded in a groove in the wiring interlayer film 28. The wiring 45f is also formed by a damascene process as in the above-mentioned wiring.

The wiring 45g is composed of a wiring embedded in a groove in the wiring interlayer film 30. The wiring 45g is also formed by a damascene process as in the above-mentioned wiring.

The opening 2a is a groove formed in the cover films 32a and 32b. For example, as shown in FIG. 3A, the opening 2a is a groove that penetrates through the cover film 32b and that reaches at a halfway position of the cover film 32a.

Note that the planar position of an edge of the groove constituting the opening 2a at the side of the element region 8a is aligned with that of an edge of the wirings 45a to 45g at the side of the element region 8a. However, even if the position of the edge of the wirings 45a to 45g at the side of the element region 8a is shifted from the position of the edge of the groove constituting the opening 2a at the side of the element region 8a within the range of 1 to 10 µm in the horizontal direction of the cross-sectional view, an advantage achieved by the presence of the opening 2a and the metal line 2b does not decrease.

The scribe edge 1 is an edge of the outermost periphery of the semiconductor device.

The advantage of the presence of the opening 2a and the metal line 2b in the semiconductor device of the first embodiment will now be described with reference to FIG. 3A.

In FIG. 3A, each of the arrows 60 and 61 shows a propagation state of a crack formed in the scribe edge 1 when the semiconductor device is cut in the scribe region 8b.

Here, in the semiconductor device, in order to form eight wiring layers, fifteen wiring interlayer films are provided, as shown in FIG. 3B. Accordingly, it is believed that the crack propagates along the wiring interlayer films as shown by the arrow 60 or 61.

Consequently, it is believed that when the metal line 2b formed by filling a groove in each of the wiring interlayer films with a metal material is provided, propagation of the crack in the wiring interlayer films can be prevented.

Insulating materials constituting the wiring interlayer films, which will be described below, do not have elasticity. Therefore, such insulating materials are easily broken when stress is applied thereto. In contrast, metal materials have elasticity, and thus, it is believed that such metal materials are not broken even when stress is applied thereto. The reason for this is as follows. When stress due to propagation of cracks is applied to a metal material, the metal material undergoes elastic deformation, thereby releasing the stress. In addition, a stress that exceeds the limit of elastic deformation of a metal material and that results in the metal material being broken is larger than a stress that results in an insulating material being broken.

Accordingly, the metal line 2b provides an advantage of reliably preventing propagation of cracks in the wiring interlayer films.

Next, in FIG. 3A, the arrow 63 shows a phenomenon in which a crack propagates from an edge of the opening 2a unless the metal line 2b is provided.

The reason why a crack propagates from an edge of the opening 2a is as follows. First, detachment of a cover film that occurs during cutting of the semiconductor device in the scribe region 8b extends. Extension of the detachment of the cover film is prevented because the groove of the opening 2a is provided in the cover film in advance. In this case, a force from the scribe region 8b is applied at the side of the element region 8a of the groove of the opening 2a.

Consequently, the present inventor has found that when the metal line 2b is provided in FIG. 3A, a crack propagating from the edge of the opening 2a propagates along the metal line 2b as shown by the arrow 62.

This structure is advantageous in that the crack propagating from the edge of the opening 2a does not reach the moisture-resistant frame-shaped shield 3, and the moisture-resistant frame-shaped shield 3 and the element region 8a are protected by the metal line 2b.

Accordingly, this structure is advantageous in that propagation of cracks formed at the side of the element region 8a of the metal line 2b can also be reliably prevented.

Thus, the semiconductor device of the first embodiment is a semiconductor device having a crack-propagation-preventing structure composed of the metal line 2b and the opening 2a.

Figure 4:
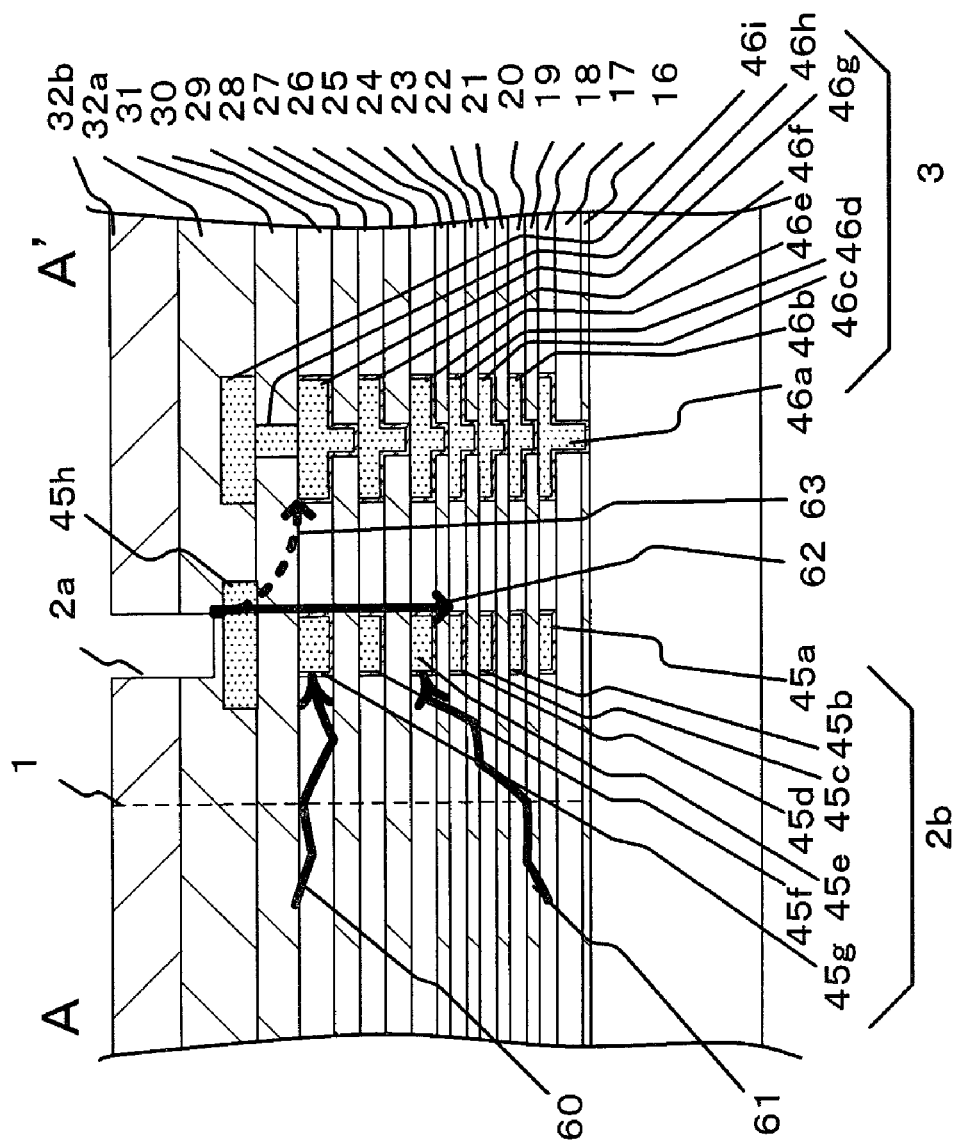
FIG. 4 is a cross-sectional view showing a modification of the semiconductor device of the first embodiment and shows a cross section corresponding to an A-A' cross section of FIG. 1 or FIG. 2.
Figure 5:
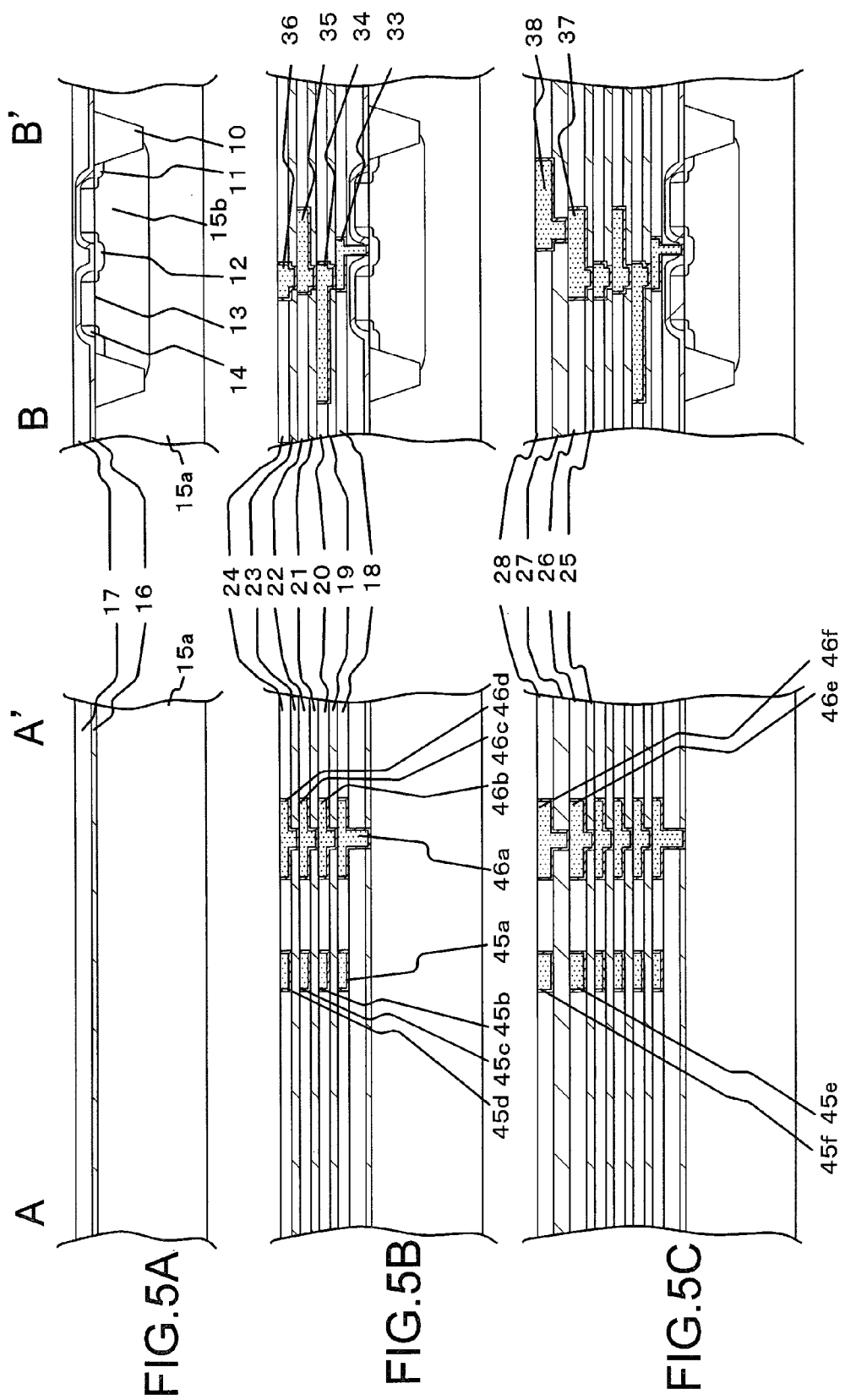
FIGS. 5A, 5B, and 5C are views illustrating steps of producing a semiconductor device of the first embodiment using an A-A' cross section and a B-B' cross section of FIG. 1 or FIG. 2.

A modification of the semiconductor device of the first embodiment will now be described with reference to FIG. 4. FIG. 4 is a cross-sectional view showing a modification of the semiconductor device of the first embodiment and shows a cross section corresponding to the A-A' cross section of FIG. 1 or FIG. 2. FIG. 4 shows a scribe edge 1, an opening 2a, a metal line 2b, a moisture-resistant frame-shaped shield 3, an insulating film 16, a contact interlayer film 17, a contact interlayer film 18, wiring interlayer films 19, 20, 21, 22, 23, 24, 25, 26, 27, 28, 29, 30, and 31, cover films 32a and 32b, wirings 45a, 45b, 45c, 45d, 45e, 45f, 45g, and 45h, wiring-and-plugs 46a, 46b, 46c, 46d, 46e, 46f, and 46g, a plug 46h, a wiring 46i, and arrows 60, 61, 62, and 63.

The same components as those shown in FIG. 1 are assigned the same reference numerals. Specifically, the scribe edge 1, the opening 2a, the metal line 2b, and the moisture-resistant frame-shaped shield 3 are the same as the scribe edge 1, the opening 2a, the metal line 2b, and the moisture-resistant frame-shaped shield 3 that are described with reference to FIG. 1. The insulating film 16, the contact interlayer film 17, the contact interlayer film 18, the wiring interlayer films 19, 20, 21, 22, 23, 24, 25, 26, 27, 28, 29, 30, and 31, and the cover films 32a and 32b are also the same as those described with reference to FIG. 1. However, this semiconductor device differs from the above-described semiconductor device in that the metal line 2b is composed of the wirings 45a, 45b, 45c, 45d, 45e, 45f, 45g, and 45h. That is, this semiconductor device further includes the wiring 45h.

The wiring 45h is a metal wiring that belongs to a wiring layer (i.e., uppermost wiring layer) to which the wiring 46i of the moisture-resistant frame-shaped shield 3 also belongs. The wiring 45h is made of aluminum. Accordingly, the wiring 45h is formed by the same step as that of forming the wiring 43 using aluminum between the steps of forming the wiring 43 in the element region 8a.

The wiring 45h has a frame shape surrounding the element region 8b and the moisture-resistant frame-shaped shield 3. The width of the wiring 45h is larger than the width of the groove of the opening 2a.

The semiconductor device of the first embodiment does not include a wiring corresponding to the wiring 46i of the moisture-resistant frame-shaped shield 3. This is because, in the case where the wiring corresponding to the wiring 46i is made of copper, a phenomenon should be prevented in which copper is exposed and a metal contamination due to copper occurs in a process apparatus.

In contrast, in this modification of the semiconductor device of the first embodiment, since the wiring 45h is made of aluminum, the problem of the metal contamination does not occur. It is known that even if a metal contamination due to aluminum occurs, the effect thereof is negligible.

Accordingly, although the cover film 32a remains between the bottom of the opening 2a and the wiring 45h in FIG. 4, the opening 2a may reach the wiring 45h.

An advantage of the presence of the opening 2a and the metal line 2b in the modification of the semiconductor device of the first embodiment shown in FIG. 4 is as follows.

In FIG. 4, when a crack propagates from the direction shown by the arrow 60 or 61, propagation of the crack can be prevented as in the case of the metal line 2b of the semiconductor device of the first embodiment.

As described above, in the case where the metal line 2b is not provided, a crack propagates from an edge of the opening 2a in the direction shown by the arrow 63.

In the metal line 2b of the semiconductor device of the first embodiment, the direction in which the crack propagates is changed to the direction shown by the arrow 62 because of the presence of the wirings 45a to 45g. Thus, propagation of cracks into the element region 8a can be prevented.

In contrast, in the metal line 2b of the modification of the semiconductor device of the first embodiment, the metal line 2b includes the wiring 45h, and the width of the wiring 45h is larger than the width of the groove of the opening 2a. Therefore, this structure is advantageous in that propagation of a crack in the direction shown by the arrow 63 can be prevented in the first place. This is because the wiring 45h made of aluminum has high elasticity.

A method of producing a semiconductor device of the first embodiment will now be described with reference to FIGS. 5A, 5B, 5C, and 6.

Figure 6:
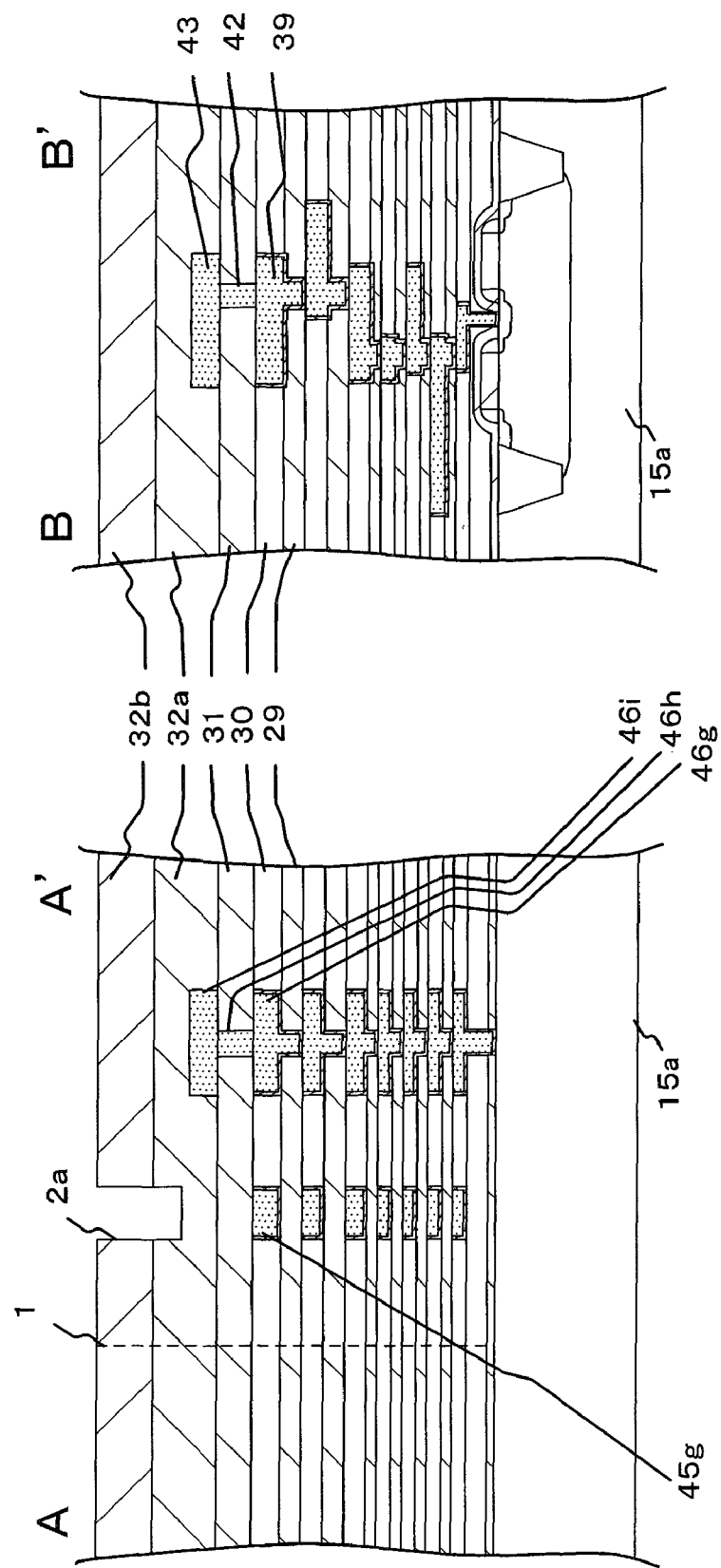
FIG. 6 includes cross-sectional views showing the A-A' cross section and the B-B' cross section of FIG. 1 or FIG. 2 of the semiconductor device of the first embodiment obtained after steps of forming an upper-layer wiring, steps of forming an uppermost-layer wiring, and steps of forming cover films.

FIGS. 5A, 5B, and 5C are views illustrating steps of producing the semiconductor device of the first embodiment using an A-A' cross section and a B-B' cross section of FIG. 1 or FIG. 2. FIG. 6 includes views showing an A-A' cross section and a B-B' cross section of FIG. 1 or FIG. 2 of the semiconductor device of the first embodiment obtained after steps of forming an upper-layer wiring, steps of forming an uppermost-layer wiring, and steps of forming cover films. FIGS. 5A, 5B, 5C, and 6 show an opening 2a, a metal line 2b, a moisture-resistant frame-shaped shield 3, a STI 10, a source region 11 of a MOS transistor, a drain region 12 of the MOS transistor, a gate electrode 13 of the MOS transistor, side walls 14, a substrate 15a, a well 15b, an insulating film 16, a contact interlayer film 17, a contact interlayer film 18, wiring interlayer films 19, 20, 21, 22, 23, 24, 25, 26, 27, 28, 29, 30, and 31, cover films 32a and 32b, wiring-and-plugs 33, 34, 35, 36, 37, 38, and 39, a plug 42, a wiring 43, wirings 45a, 45b, 45c, 45d, 45e, 45f, and 45g, wiring-and-plugs 46a, 46b, 46c, 46d, 46e, 46f, and 46g, a plug 46h, and a wiring 46i. The same components as those shown in FIGS. 3A and 3B are assigned the same reference numerals.

FIG. 5A shows the A-A' cross section and the B-B' cross section of FIG. 1 or FIG. 2. FIG. 5A shows a cross section of the semiconductor device of the first embodiment obtained after steps of forming a bulk. The steps of forming a bulk include steps of forming the MOS transistor by a known process.

For example, as shown in the B-B' cross section of FIG. 5A, the STI 10 for electrically isolating a semiconductor element is formed on the substrate 15a. Subsequently, an impurity of a conductivity type opposite to that of the MOS transistor is introduced in the well 15b by ion implantation. A heat treatment is then performed to form the well 15b. A gate insulating film is formed on the surface of the substrate 15a. A silicon oxide film or a high dielectric film is used as the gate insulating film. Subsequently, polysilicon is deposited on the gate insulating film, and a photomask having the shape of a gate electrode is then formed thereon by photolithography. The polysilicon is then etched by anisotropic etching to form the gate electrode 13. Subsequently, an impurity of a conductivity type the same as the conductivity type of the MOS transistor is introduced in source/drain extension regions by ion implantation using the gate electrode 13 as a mask. Accordingly, the source/drain extension regions are formed at both sides of the gate electrode 13. An insulating film is deposited on the MOS transistor and then anisotropically etched, thereby forming the side walls 14 on the side walls of the gate electrode 13. An impurity of a conductivity type the same as the conductivity type of the MOS transistor is introduced in source/drain regions by ion implantation using the gate electrode 13 and the side walls 14 as a mask. Accordingly, the source/drain regions are formed at both sides of the side walls 14, thus forming a diffusion region where the source/drain regions are integrated with the source/drain extension regions. The insulating film 16 is then deposited on the MOS transistor.

On the other hand, in the A-A' cross section of FIG. 5A, the gate insulating film and the insulating film 16 are also formed on the portion corresponding to the moisture-resistant frame-shaped shield 3 in the step of forming the gate insulating film and the step of forming the insulating film 16, respectively, among the above-described steps. However, no components are formed in other steps. However, a diffusion layer in which an impurity of a conductivity type the same as the conductivity type of the substrate 15a is introduced may be formed in the substrate 15a located under the wiring-and-plug 46a included in the moisture-resistant frame-shaped shield 3 in the step of forming the source/drain regions of the MOS transistor. This is because the electric potential of the moisture-resistant frame-shaped shield 3 is stabilized. Furthermore, the gate insulating film and the insulating film 16 are also formed at the position corresponding to the metal line 2b in the step of forming the gate insulating film and the step of forming the insulating film 16, respectively.

FIG. 5B shows the A-A' cross section and the B-B' cross section of FIG. 1 or FIG. 2 of the semiconductor device of the first embodiment obtained after steps of forming a lower-layer wiring. The steps of forming a lower-layer wiring include steps of forming the lower-layer wiring portion by a known process, i.e., a dual damascene process.

For example, in the B-B' cross section of FIG. 5B, the contact interlayer film 17 composed of a silicon oxide film and a silicon nitride film, and the contact interlayer film 18 composed of a silicon oxide film are deposited by chemical vapor deposition (CVD).

Subsequently, a groove for forming a wiring connected to the MOS transistor therein is formed in the contact interlayer film 18. A via that is in contact with the source region 11, the drain region 12, and the gate electrode 13 of the MOS transistor is then formed in the contact interlayer film 17. Subsequently, tantalum or tantalum nitride is deposited inside the via and the groove by CVD. Copper is then deposited thereon by plating. Copper disposed on the contact interlayer film 18 is then removed by chemical mechanical polishing (CMP).

As a result, copper is embedded in the groove and the via to form the wiring-and-plug 33.

On the other hand, in the A-A' cross section of FIG. 5B, the above-described steps are performed in the same manner, and thus, the wiring-and-plug 46a is formed at the position corresponding to the moisture-resistant frame-shaped shield 3. No via is formed in the contact interlayer film 17 at the position corresponding to the metal line 2b. Consequently, a plug made of copper is not formed in the contact interlayer film 17. Accordingly, in the above steps, the wiring 45a is formed in a groove in the contact interlayer film 18 at the position corresponding to the metal line 2b.

The wiring interlayer films 19 and 20, the wiring-and-plug 34, the wiring-and-plug 46b forming the moisture-resistant frame-shaped shield 3, and the wiring 45b forming the metal line 2b, all of which are shown in FIG. 5B, are formed by the same steps as those described above.

Furthermore, the wiring interlayer films 21, 22, 23, and 24, the wiring-and-plugs 35 and 36, the wiring-and-plugs 46c and 46d forming the moisture-resistant frame-shaped shield 3, and the wirings 45c and 45d forming the metal line 2b, all of which are shown in FIG. 5B, are formed by repeating the same steps as those described above.

FIG. 5C shows the A-A' cross section and the B-B' cross section of FIG. 1 or FIG. 2 of the semiconductor device of the first embodiment obtained after steps of forming an intermediate-layer wiring. The steps of forming an intermediate-layer wiring include steps of forming the intermediate-layer wiring portion by a known process, i.e., a dual damascene process.

Accordingly, the wiring interlayer films 25, 26, 27, and 28, the wiring-and-plugs 37 and 38, the wiring-and-plugs 46e and 46f forming the moisture-resistant frame-shaped shield 3, and the wirings 45e and 45f forming the metal line 2b are formed by repeating the same steps as those described in the steps of forming a lower-layer wiring.

FIG. 6 includes cross-sectional views showing the A-A' cross section and the B-B' cross section of FIG. 1 or FIG. 2 of the semiconductor device of the first embodiment obtained after steps of forming an upper-layer wiring, steps of forming an uppermost-layer wiring, and steps of forming cover films.

The steps of forming an upper-layer wiring include steps of forming the upper-layer wiring portion by a known process, i.e., a dual damascene process. Accordingly, the wiring interlayer films 29 and 30, the wiring-and-plug 39, the wiring-and-plug 46g forming the moisture-resistant frame-shaped shield 3, and the wiring 45g forming the metal line 2b are formed by the same steps as those described above.

The steps of forming an uppermost-layer wiring include steps of forming the uppermost-layer wiring portion by known steps of forming a wiring and a plug.

For example, as shown in the B-B' cross section of FIG. 6, the wiring interlayer film 31 composed of a silicon oxide film is deposited by CVD. A via to be connected to the wiring-and-plug 39 is then formed on the wiring interlayer film 31. Subsequently, tungsten is deposited over the entire surface of the wiring interlayer film 31 by sputtering or CVD. Tungsten deposited on the wiring interlayer film 31 is then removed by CMP. Consequently, tungsten is embedded in the via in the wiring interlayer film 31, thus forming the plug 42 made of tungsten. Subsequently, aluminum is deposited on the wiring interlayer film 31 by sputtering. A resist pattern having a shape of wiring is then formed on aluminum by photolithography. The resist pattern is then anisotropically etched to form the wiring 43.

On the other hand, as shown in the A-A' cross section of FIG. 6, the plug 46h and the wiring 46i of the moisture-resistant frame-shaped shield 3 are formed by the same steps as those described above.

An uppermost-layer wiring forming the metal line 2b is not formed in order that the bottom of a groove of the opening 2a described below is not in contact with the uppermost-layer wiring when the opening 2a is formed. When an uppermost-layer wiring forming the metal line 2b is provided and if the bottom of the groove of the opening 2a is in contact with the uppermost-layer wiring, the following problem occurs. In the case where the uppermost-layer wiring is made of copper, copper is exposed and a process apparatus may be contaminated with copper in the step and subsequent steps. In addition, unless the depth of the groove of the opening 2a is sufficient, extension of the detachment of the cover films 32a and 32b cannot be prevented.

In the B-B' cross section of FIG. 6, the steps of forming cover films include steps of forming the cover films 32a and 32b by depositing silicon oxide or silicon nitride by CVD. On the other hand, in the A-A' cross section of FIG. 6, after the formation of the cover films 32a and 32b, a resist pattern having an opening corresponding to the opening 2a is formed on the cover film 32b by photolithography. Subsequently, the cover films 32a and 32b are etched by anisotropic etching to form the groove of the opening 2a. Note that the position of an edge of the opening 2a at the side of the moisture-resistant frame-shaped shield 3 is substantially aligned with the position of an edge of the wirings 45a, 45b, 45c, 45d, 45e, 45f, and 45g forming the metal line 2b at the side of the moisture-resistant frame-shaped shield 3, when viewed in the cross-sectional view. This is because a crack propagating from an edge of the opening 2a propagates along the metal line 2b as shown by the arrow 62 in the case where the metal line 2b is provided.

In the method of producing a semiconductor device of the first embodiment, the metal line 2b and the opening 2a can be easily formed by the same steps as those of forming a semiconductor element and wirings in the element region 8a. As a result, propagation of cracks from the metal line 2b to the moisture-resistant frame-shaped shield 3 can be prevented.

Second Embodiment

A semiconductor device of a second embodiment will now be described with reference to FIG. 7. In the semiconductor device of the second embodiment, wirings forming the metal line 2b of the first embodiment are changed to wiring-and-plugs.

Figure 7:
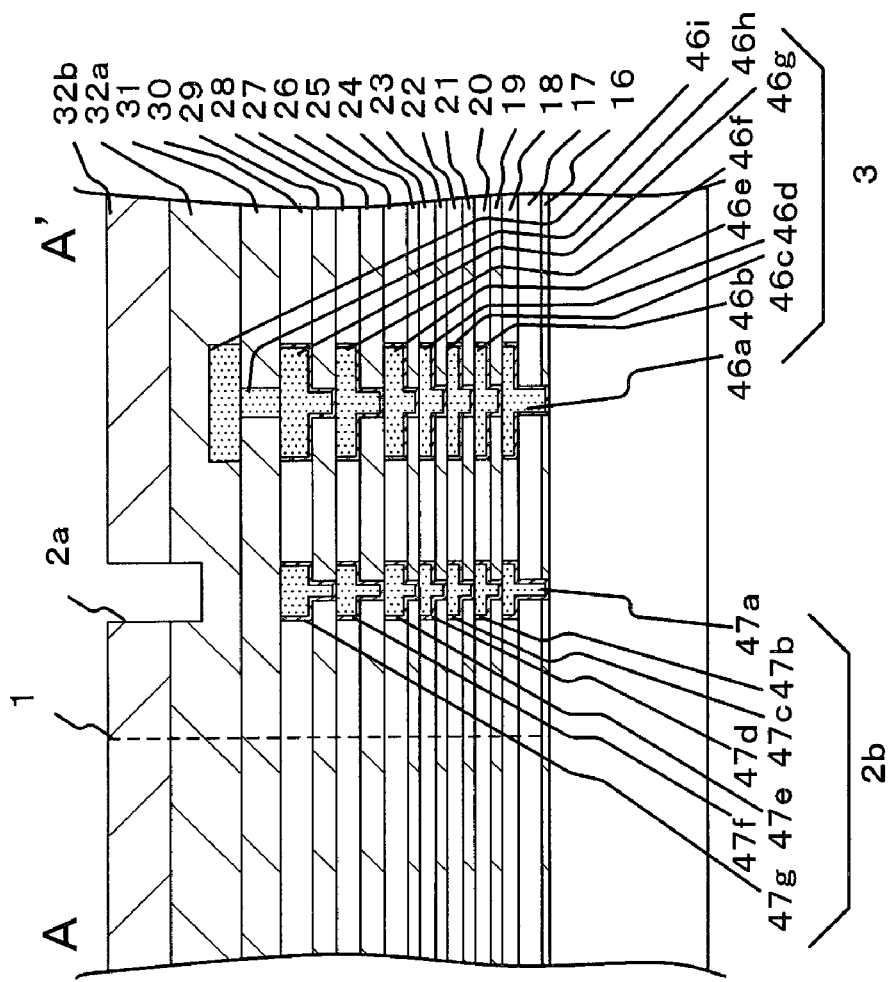
FIG. 7 is a cross-sectional view showing an A-A' cross section of a semiconductor device of a second embodiment.

FIG. 7 is a cross-sectional view showing an A-A' cross section of the semiconductor device of the second embodiment. FIG. 7 shows a scribe edge 1, an opening 2a, a metal line 2b, a moisture-resistant frame-shaped shield 3, an insulating film 16, a contact interlayer film 17, a contact interlayer film 18, wiring interlayer films 19, 20, 21, 22, 23, 24, 25, 26, 27, 28, 29, 30, and 31, and cover films 32a and 32b.

The same components as those shown in FIGS. 1, 2, 3A, 3B, 5A, 5B, 5C, and 6 are assigned the same reference numerals.

The plan view of the semiconductor device of the second embodiment is the same as FIG. 1 or FIG. 2. Accordingly, the planar positional relationship of the scribe edge 1, the opening 2a, the metal line 2b, and moisture-resistant frame-shaped shield 3 is the same as the positional relationship described with reference to FIG. 1 and FIG. 2.

However, the metal line 2b shown in FIG. 7 differs from the metal line 2b of the first embodiment in that the metal line 2b of this embodiment is composed of wiring-and-plugs 47a, 47b, 47c, 47d, 47e, 47f, and 47g.

The wiring-and-plugs constituting the metal line 2b do not include a wiring disposed at a position corresponding to the plug 46h and the wiring 46i forming the moisture-resistant frame-shaped shield 3. This is because it is necessary to ensure a certain amount of the depth of a groove of the opening 2a. As in the semiconductor device of the first embodiment, the position of an edge of the wiring-and-plugs 47a, 47b, 47c, 47d, 47e, 47f, and 47g at the side of the element region 8a is aligned with the position of an edge of the groove of the opening 2a at the side of the element region 8a.

Each of the wiring-and-plugs 47a, 47b, 47c, 47d, 47e, 47f, and 47g is connected to adjacent wiring-and-plugs and integrated with each other.

The wiring-and-plug 47a is composed of a wiring embedded in a groove in the contact interlayer film 18 and a contact plug embedded in a via in the contact interlayer film 17. Here, the via includes not only a known via used in the element region 8a but also a groove-shaped via. The above wiring and contact plug are made of copper covered with tantalum or tantalum nitride. Tantalum or tantalum nitride functions as a diffusion-preventing film that prevents copper from diffusing in the contact interlayer films 17 and 18. The wiring-and-plug 47a is formed together with the wiring-and-plug 33 in the element region 8a by a dual damascene process.

The wiring-and-plug 47b is composed of a wiring embedded in a groove in the wiring interlayer film 20 and a contact plug embedded in a via in the wiring interlayer film 19. The wiring-and-plug 47b is formed together with the wiring-and-plug 34 in the element region 8a by a dual damascene process as in the above-mentioned wiring-and-plug.

The wiring-and-plug 47c is composed of a wiring embedded in a groove in the wiring interlayer film 22 and a contact plug embedded in a via in the wiring interlayer film 21. The wiring-and-plug 47c is formed together with the wiring-and-plug 35 in the element region 8a by a dual damascene process as in the above-mentioned wiring-and-plug.

The wiring-and-plug 47d is composed of a wiring embedded in a groove in the wiring interlayer film 24 and a contact plug embedded in a via in the wiring interlayer film 23. The wiring-and-plug 47d is formed together with the wiring-and-plug 36 in the element region 8a by a dual damascene process as in the above-mentioned wiring-and-plug.

The wiring-and-plug 47e is composed of a wiring embedded in a groove in the wiring interlayer film 26 and a contact plug embedded in a via in the wiring interlayer film 25. The wiring-and-plug 47e is formed together with the wiring-and-plug 37 in the element region 8a by a dual damascene process as in the above-mentioned wiring-and-plug.

The wiring-and-plug 47f is composed of a wiring embedded in a groove in the wiring interlayer film 28 and a contact plug embedded in a via in the wiring interlayer film 27. The wiring-and-plug 47f is formed together with the wiring-and-plug 38 in the element region 8a by a dual damascene process as in the above-mentioned wiring-and-plug.

The wiring-and-plug 47g is composed of a wiring embedded in a groove in the wiring interlayer film 30 and a contact plug embedded in a via in the wiring interlayer film 29. The wiring-and-plug 47g is formed together with the wiring-and-plug 39 in the element region 8a by a dual damascene process as in the above-mentioned wiring-and-plug.

Referring to FIG. 3A, it is believed that, in the scribe region 8b, a crack formed in the scribe edge 1 during cutting of the semiconductor device propagates along wiring interlayer films as shown by the arrow 60 or 61.

Referring to FIG. 7, in the metal line 2b of the second embodiment, a metal material embedded in a groove or a via provided in all the wiring interlayer films is present. Accordingly, it is believed that the metal line 2b of the second embodiment has a higher effect of preventing propagation of cracks in the wiring interlayer films than that of the metal line 2b of the first embodiment.

Insulating materials constituting the wiring interlayer films, which will be described below, do not have elasticity. Therefore, such insulating materials are easily broken when stress is applied thereto. In contrast, metal materials have elasticity, and thus, it is believed that such metal materials are not broken even when stress is applied thereto. The reason for this is as follows. Metal materials have elasticity. Therefore, when stress due to propagation of cracks is applied to a metal material, the metal material undergoes elastic deformation, thereby releasing the stress.

Accordingly, the metal line 2b of the second embodiment has an effect of reliably preventing propagation of cracks in the wiring interlayer films.

Thus, the semiconductor device of the second embodiment is a semiconductor device having a crack-propagation-preventing structure composed of the metal line 2b and the opening 2a.

As described above, the metal line 2b of the second embodiment can also be easily formed by the same steps as those of forming a semiconductor element and wirings in the element region 8a.

Third Embodiment

A semiconductor device of a third embodiment will now be described with reference to FIG. 8. In the semiconductor device of the third embodiment, the width of wirings constituting a metal line 2b is large, and the wirings project to the side of the scribe region 8b.

Figure 8:
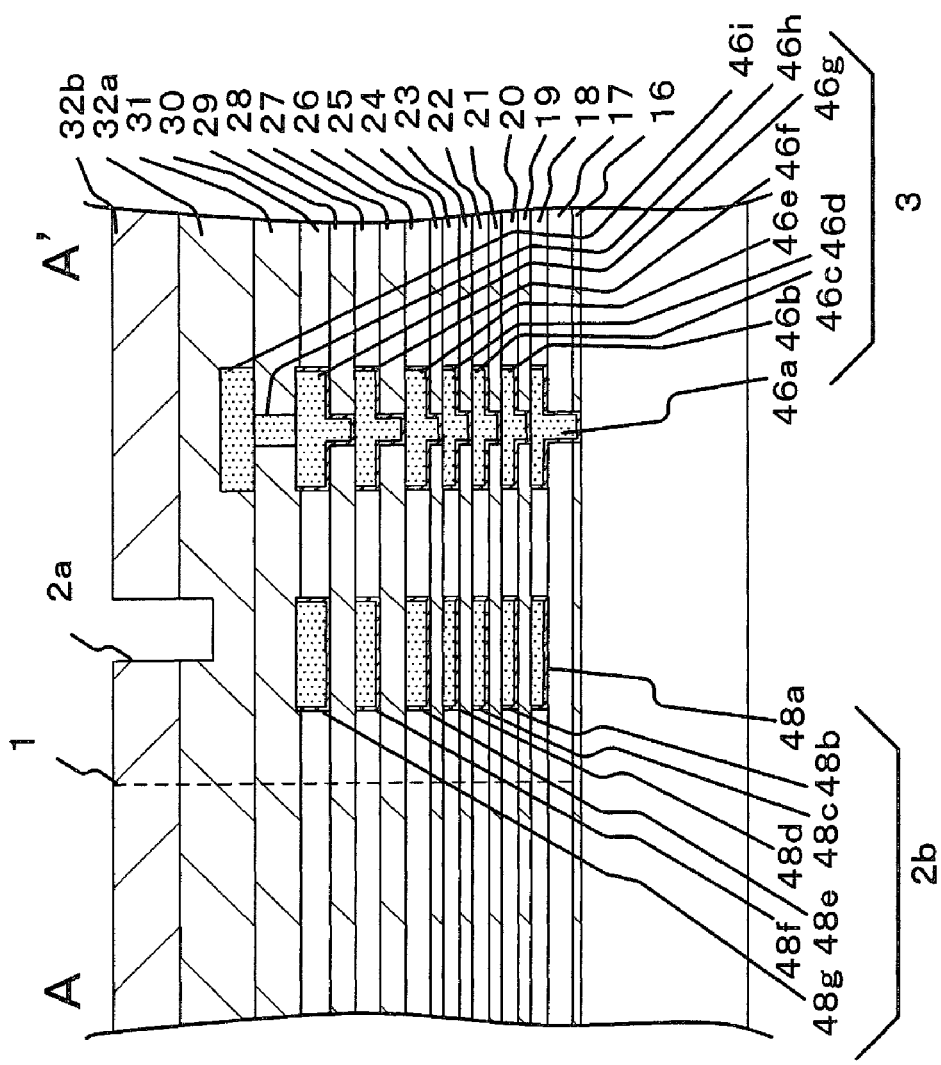
FIG. 8 is a cross-sectional view showing an A-A' cross section of a semiconductor device of a third embodiment.

FIG. 8 is a cross-sectional view showing an A-A' cross section of the semiconductor device of the third embodiment. FIG. 8 shows a scribe edge 1, an opening 2a, a metal line 2b, a moisture-resistant frame-shaped shield 3, an insulating film 16, a contact interlayer film 17, a contact interlayer film 18, wiring interlayer films 19, 20, 21, 22, 23, 24, 25, 26, 27, 28, 29, 30, and 31, and cover films 32a and 32b.

The same components as those shown in FIGS. 1, 2, 3A, 3B, 5A, 5B, 5C, and 6 are assigned the same reference numerals.

The plan view of the semiconductor device of the third embodiment is the same as FIG. 1 or FIG. 2. Accordingly, the planar positional relationship of the scribe edge 1, the opening 2a, the metal line 2b, and moisture-resistant frame-shaped shield 3 is the same as the positional relationship described with reference to FIG. 1 and FIG. 2.

However, the metal line 2b shown in FIG. 8 differs from the metal line 2b of the first embodiment in that the metal line 2b is composed of wirings 48a, 48b, 48c, 48d, 48e, 48f, and 48g.

The wirings constituting the metal line 2b do not include a wiring disposed at a position corresponding to the plug 46h and the wiring 46i forming the moisture-resistant frame-shaped shield 3. This is because it is necessary to ensure a certain amount of the depth of a groove of the opening 2a. As in the semiconductor device of the first embodiment, the position of an edge of the wirings 48a, 48b, 48c, 48d, 48e, 48f, and 48g at the side of the element region 8a is aligned with the position of an edge of the groove of the opening 2a at the side of the element region 8a.

The width of each of the wirings 48a, 48b, 48c, 48d, 48e, 48f, and 48g is larger than the width of the groove of the opening 2a. An edge of each of the wirings 48a to 48g at the side of the scribe region 8b projects toward the side of the scribe region 8b with respect to an edge of the groove of the opening 2a at the side of the scribe region 8b.

The wiring 48a is composed of a wiring embedded in a groove in the contact interlayer film 18. This wiring 48a is made of copper covered with tantalum or tantalum nitride. Tantalum or tantalum nitride functions as a diffusion-preventing film that prevents copper from diffusing in the contact interlayer film 18. The wiring 48a is formed together with the wiring portion of the wiring-and-plug 33 in the element region 8a by a damascene process.

The wiring 48b is composed of a wiring embedded in a groove in the wiring interlayer film 20. The wiring 48b is formed together with the wiring portion of the wiring-and-plug 34 in the element region 8a by a damascene process as in the above-mentioned wiring.

The wiring 48c is composed of a wiring embedded in a groove in the wiring interlayer film 22. The wiring 48c is formed together with the wiring portion of the wiring-and-plug 35 in the element region 8a by a damascene process as in the above-mentioned wiring.

The wiring 48d is composed of a wiring embedded in a groove in the wiring interlayer film 24. The wiring 48d is formed together with the wiring portion of the wiring-and-plug 36 in the element region 8a by a damascene process as in the above-mentioned wiring.

The wiring 48e is composed of a wiring embedded in a groove in the wiring interlayer film 26. The wiring 48e is formed together with the wiring portion of the wiring-and-plug 37 in the element region 8a by a damascene process as in the above-mentioned wiring.

The wiring 48f is composed of a wiring embedded in a groove in the wiring interlayer film 28. The wiring 48f is formed together with the wiring portion of the wiring-and-plug 38 in the element region 8a by a damascene process as in the above-mentioned wiring.

The wiring 48g is composed of a wiring embedded in a groove in the wiring interlayer film 30. The wiring 48g is formed together with the wiring portion of the wiring-and-plug 39 in the element region 8a by a damascene process as in the above-mentioned wiring.

Referring to FIG. 3A, it is believed that, in the scribe region 8b, a crack formed in the scribe edge 1 during cutting of the semiconductor device propagates along wiring interlayer films as shown by the arrow 60 or 61.

Consequently, referring to FIG. 8, in the metal line 2b of the third embodiment, a metal material embedded in grooves in the wiring interlayer films is present. In addition, an edge of the grooves for the metal line 2b of the third embodiment at the side of the scribe region 8b is located nearer the scribe region 8b, compared with an edge of the grooves for the metal line 2b of the first embodiment at the side of the scribe region 8b. Therefore, it is believed that the metal line 2b of the third embodiment has a higher effect of preventing propagation of cracks in the wiring interlayer films than the effect achieved by the metal line 2b of the first embodiment. The reason for this is as follows. Since the width of the each of the grooves including the metal material therein is large and an end of each of the grooves is located nearer to the scribe region 8b, propagation of cracks from the scribe region 8b can be stopped at a position nearer to the scribe region 8b.

Accordingly, the metal line 2b of the third embodiment has an effect of more strongly and reliably preventing propagation of cracks in the wiring interlayer films.

Thus, the semiconductor device of the third embodiment is a semiconductor device having a crack-propagation-preventing structure composed of the metal line 2b and the opening 2a.

As described above, the metal line 2b of the third embodiment can also be easily formed by the same steps as those of forming a semiconductor element and wirings in the element region 8a.

Fourth Embodiment

Semiconductor devices of a fourth embodiment will now be described with reference to FIGS. 9, 10, 11, and 12. In the semiconductor devices of the fourth embodiment, a metal line 4 is further provided between a metal line 2b and a scribe region 8b.

Figure 9:
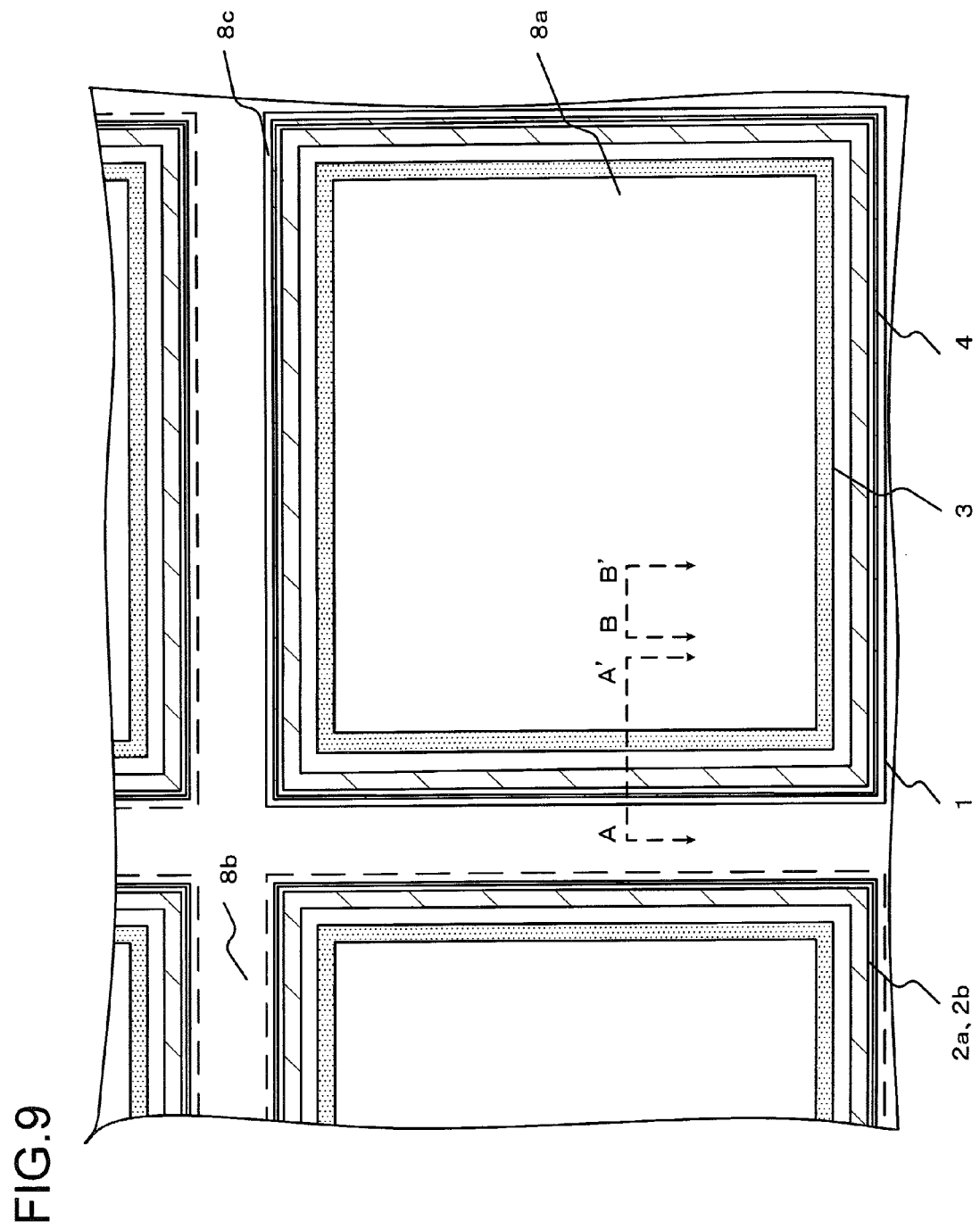
FIG. 9 is a plan view showing a semiconductor device of a fourth embodiment.

FIG. 9 is a plan view showing a semiconductor device of the fourth embodiment. FIG. 9 shows a scribe edge 1, an opening 2a, a metal line 2b, a moisture-resistant frame-shaped shield 3, the metal line 4, the element region 8a, the scribe region 8b, and an outer peripheral region 8c. The same components as those shown in FIG. 1 or FIG. 2 are assigned the same reference numerals.

Accordingly, the description and the arrangement of the scribe edge 1, the opening 2a, the metal line 2b, the moisture-resistant frame-shaped shield 3, the element region 8a, the scribe region 8b, and the outer peripheral region 8c are the same as the description and the arrangement in FIG. 1 or FIG. 2.

The metal line 4 is disposed between the opening 2a and the metal line 2b provided thereunder and the scribe edge 1 in plan view so as to surround the element region 8a. The metal line 4 is composed of a metal wiring having a certain width and forms a continuous frame. As described below, the metal line 4 is composed of a metal material embedded in grooves in a plurality of wiring interlayer films. That is, each of the grooves also has a continuous frame shape.

Figure 10:
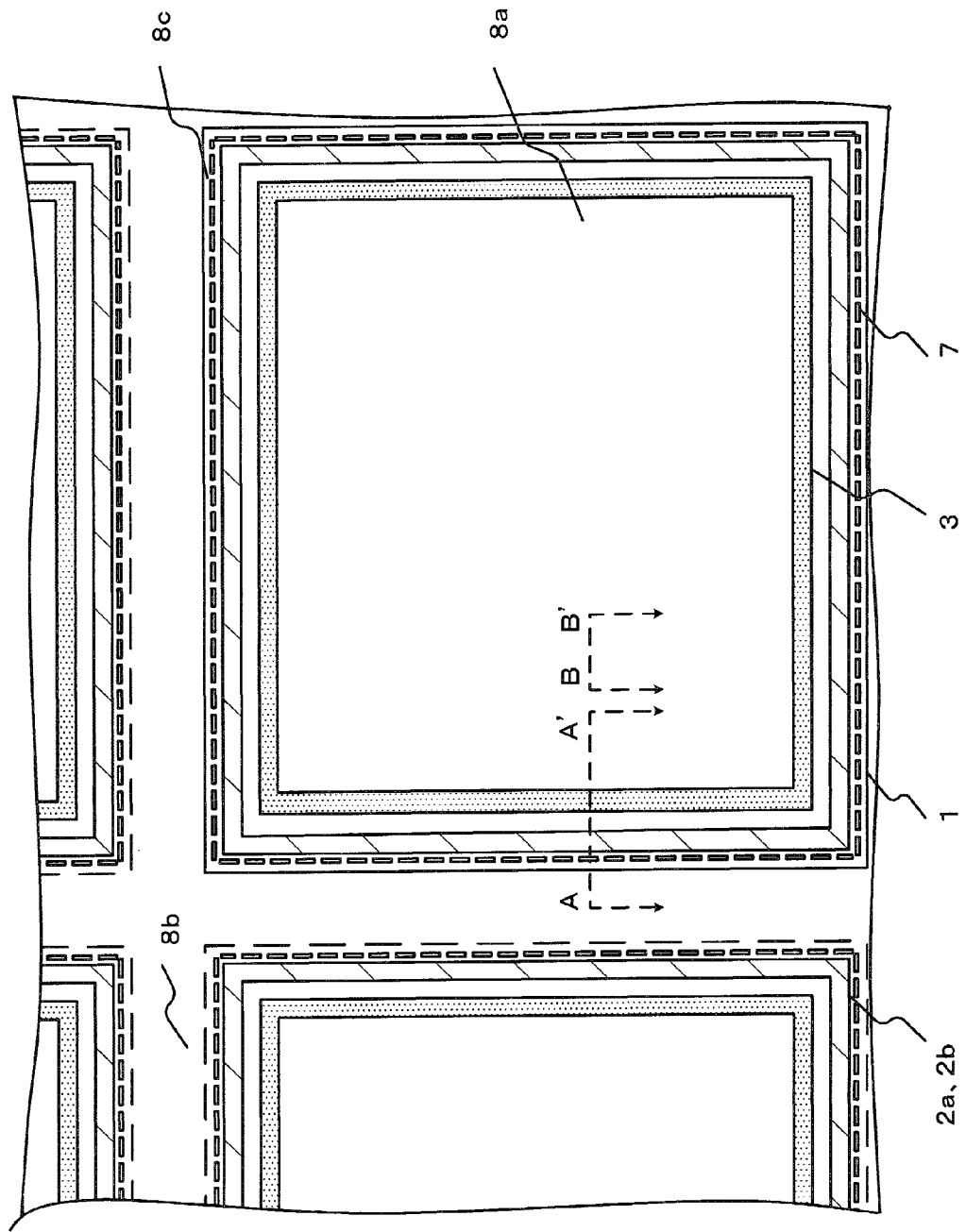
FIG. 10 is a plan view showing a modification of the semiconductor device of the fourth embodiment.

FIG. 10 is a plan view showing a modification of the semiconductor device of the fourth embodiment. FIG. 10 shows a scribe edge 1, an opening 2a, a metal line 2b, a moisture-resistant frame-shaped shield 3, a metal line 7, the element region 8a, the scribe region 8b, and an outer peripheral region 8c. The same components as those shown in FIG. 1 or FIG. 2 are assigned the same reference numerals.

Accordingly, the description and the arrangement of the scribe edge 1, the opening 2a, the metal line 2b, the moisture-resistant frame-shaped shield 3, the element region 8a, the scribe region 8b, and the outer peripheral region 8c are the same as the description and the arrangement in FIG. 1 or FIG. 2.

The metal line 7 is disposed between the opening 2a and the metal line 2b provided thereunder and the scribe edge 1 in plan view so as to surround the element region 8a. The metal line 7 is composed of a metal wiring having a certain width and a certain length and is arranged so as to form a discontinuous frame. As described below, the metal line 7 is composed of a metal material embedded in grooves in a plurality of wiring interlayer films. That is, each of the grooves also has a certain width and a certain length and arranged so as to form a continuous frame.

Figure 11:
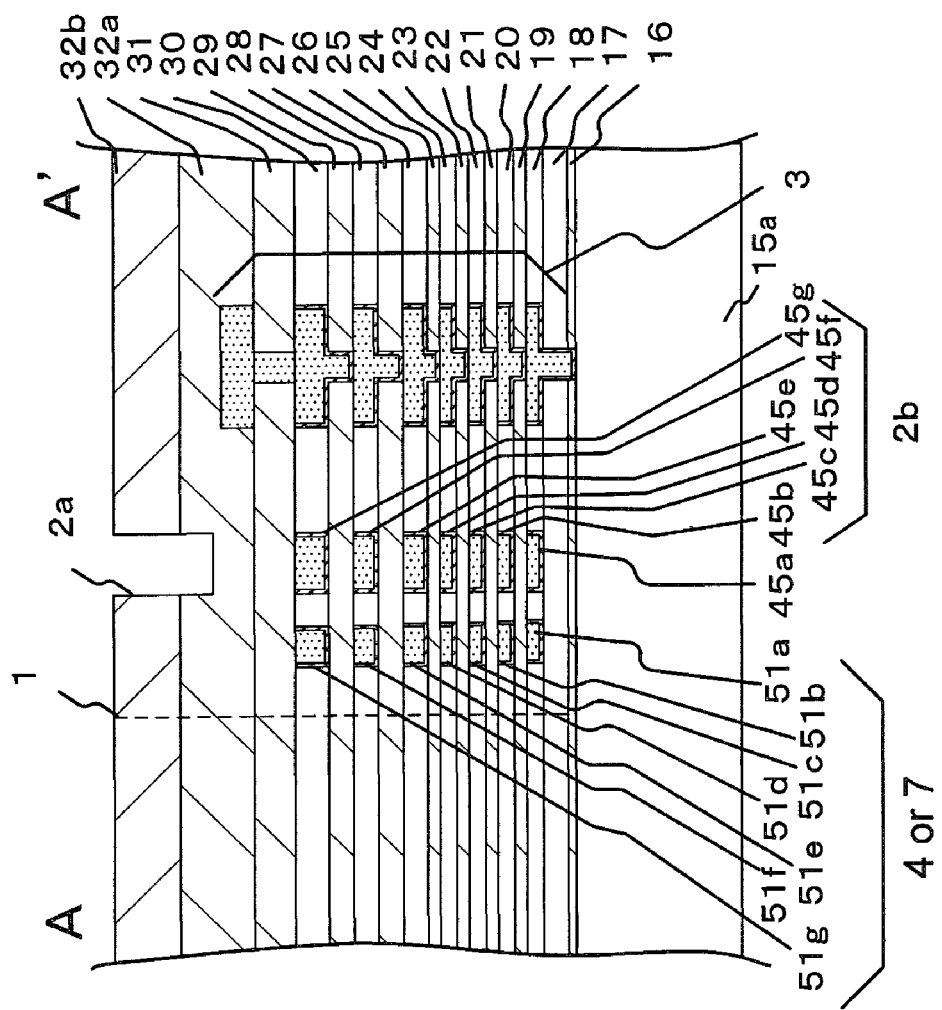
FIG. 11 is a cross-sectional view showing a first example of an A-A' cross-sectional structure of the semiconductor device of the fourth embodiment.

FIG. 11 is a cross-sectional view showing a first example of an A-A' cross-sectional structure of the semiconductor device of the fourth embodiment. FIG. 11 shows a scribe edge 1, an opening 2a, the metal line 2b, the moisture-resistant frame-shaped shield 3, a metal line 4 or 7, an insulating film 16, a contact interlayer film 17, a contact interlayer film 18, wiring interlayer films 19, 20, 21, 22, 23, 24, 25, 26, 27, 28, 29, 30, and 31, and cover films 32a and 32b.

The same components as those shown in FIGS. 1, 2, 3A, 3B, 5A, 5B, 5C, and 6 are assigned the same reference numerals. Accordingly, the structures of the wirings 45a, 45b, 45c, 45d, 45e, 45f, and 45g constituting the metal line 2b are the same as those shown in FIG. 3A.

The cross-sectional view shown by FIG. 11 differs from the cross-sectional view showing the A-A' cross section of the semiconductor device of the first embodiment shown by FIG. 3A in that the metal line 4 or 7 is further provided.

The metal line 4 or 7 shown in FIG. 11 is composed of wirings 51a, 51b, 51c, 51d, 51e, 51f, and 51g.

The wirings constituting the metal line 4 or 7 do not include a wiring disposed at a position corresponding to the plug 46h and the wiring 46i forming the moisture-resistant frame-shaped shield 3. This is because it is necessary to ensure a certain amount of the depth of a groove of the opening 2a. The wirings 51a, 51b, 51c, 51d, 51e, 51f, and 51g are disposed between the scribe edge 1 and the metal line 2b.

Each of the wirings 51a, 51b, 51c, 51d, 51e, 51f, and 51g preferably has the same width as that of each of the wirings constituting the metal line 2b. However, the width of the wirings 51a to 51g is not particularly limited as long as the wirings 51a to 51g do not project to the scribe region 8b.

The wiring 51a is composed of a wiring embedded in a groove in the contact interlayer film 18. This wiring 51a is made of copper covered with tantalum or tantalum nitride. Tantalum or tantalum nitride functions as a diffusion-preventing film that prevents copper from diffusing in the contact interlayer film 18. The wiring 51a is formed together with the wiring portion of the wiring-and-plug 33 in the element region 8a by a damascene process.

The wiring 51b is composed of a wiring embedded in a groove in the wiring interlayer film 20. The wiring 51b is formed together with the wiring portion of the wiring-and-plug 34 in the element region 8a by a damascene process as in the above-mentioned wiring.

The wiring 51c is composed of a wiring embedded in a groove in the wiring interlayer film 22. The wiring 51c is formed together with the wiring portion of the wiring-and-plug 35 in the element region 8a by a damascene process as in the above-mentioned wiring.

The wiring 51d is composed of a wiring embedded in a groove in the wiring interlayer film 24. The wiring 51d is formed together with the wiring portion of the wiring-and-plug 36 in the element region 8a by a damascene process as in the above-mentioned wiring.

The wiring 51e is composed of a wiring embedded in a groove in the wiring interlayer film 26. The wiring 51e is formed together with the wiring portion of the wiring-and-plug 37 in the element region 8a by a damascene process as in the above-mentioned wiring.

The wiring 51f is composed of a wiring embedded in a groove in the wiring interlayer film 28. The wiring 51f is formed together with the wiring portion of the wiring-and-plug 38 in the element region 8a by a damascene process as in the above-mentioned wiring.

The wiring 51g is composed of a wiring embedded in a groove in the wiring interlayer film 30. The wiring 51g is formed together with the wiring portion of the wiring-and-plug 39 in the element region 8a by a damascene process as in the above-mentioned wiring.

Figure 12:
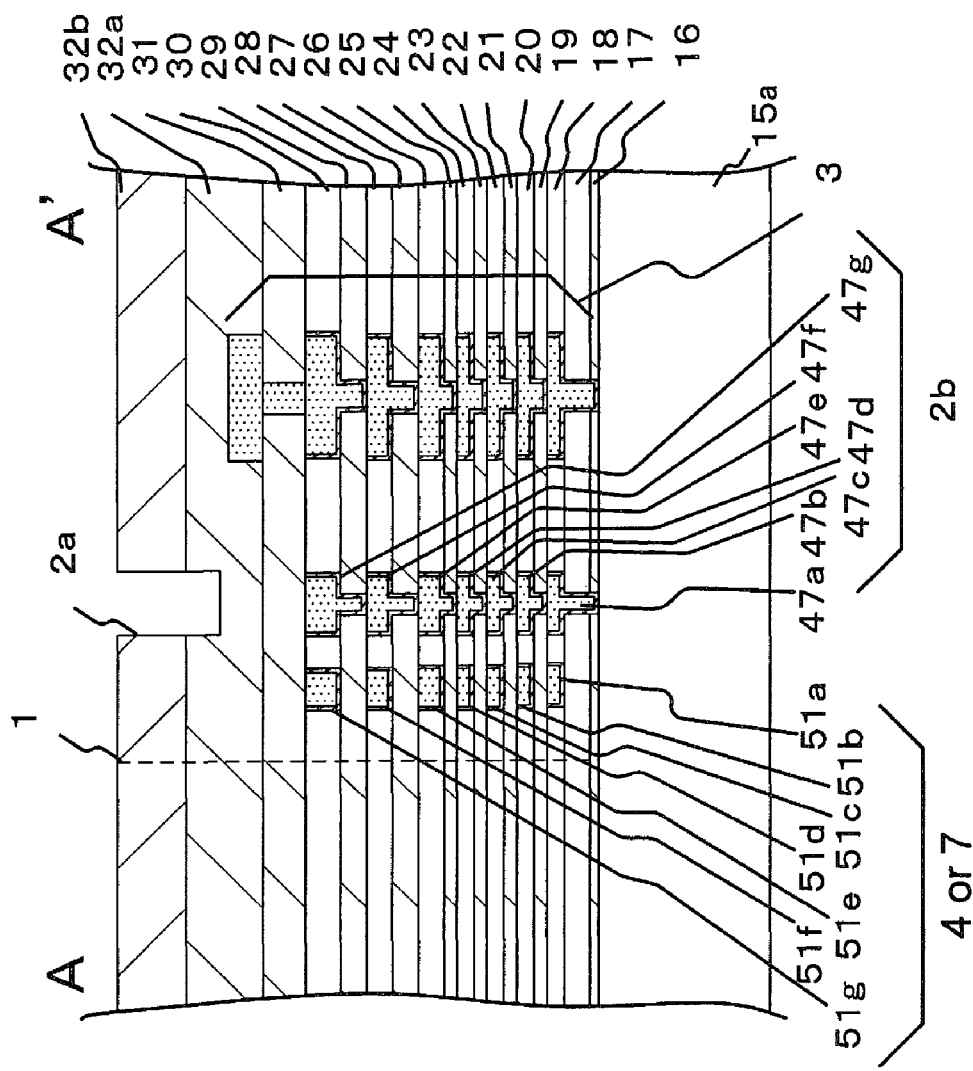
FIG. 12 is a cross-sectional view showing a second example of an A-A' cross-sectional structure of the semiconductor device of the fourth embodiment.

FIG. 12 is a cross-sectional view showing a second example of an A-A' cross-sectional structure of the semiconductor device of the fourth embodiment. FIG. 12 shows a scribe edge 1, an opening 2a, the metal line 2b, the moisture-resistant frame-shaped shield 3, a metal line 4 or 7, an insulating film 16, a contact interlayer film 17, a contact interlayer film 18, wiring interlayer films 19, 20, 21, 22, 23, 24, 25, 26, 27, 28, 29, 30, and 31, and cover films 32a and 32b.

The same components as those shown in FIGS. 1, 2, 3A, 3B, 5A, 5B, 5C, 6, and 7 are assigned the same reference numerals. Accordingly, the structures of the wiring-and-plugs 47a, 47b, 47c, 47d, 47e, 47f, and 47g constituting the metal line 2b are the same as those shown in FIG. 7.

The cross-sectional view shown by FIG. 12 differs from the cross-sectional view showing the A-A' cross section of the semiconductor device of the second embodiment shown by FIG. 7 in that the metal line 4 or 7 is further provided.

The metal line 4 or 7 shown in FIG. 12 is composed of wirings 51a, 51b, 51c, 51d, 51e, 51f, and 51g.

The wirings constituting the metal line 4 or 7 do not include a wiring disposed at a position corresponding to the plug 46h and the wiring 46i forming the moisture-resistant frame-shaped shield 3. This is because it is necessary to ensure a certain amount of the depth of a groove of the opening 2a. The wirings 51a, 51b, 51c, 51d, 51e, 51f, and 51g are disposed between the scribe edge 1 and the metal line 2b.

Each of the wirings 51a, 51b, 51c, 51d, 51e, 51f, and 51g preferably has the same width as that of each of the wirings constituting the metal line 2b. However, the width of the wirings 51a to 51g is not particularly limited as long as the wirings 51a to 51g do not project to the scribe region 8b.

The wirings 51a, 51b, 51c, 51d, 51e, 51f, and 51g are the same as those described in FIG. 11.

Referring to FIG. 3A, it is believed that, in the scribe region 8b, a crack formed in the scribe edge 1 during cutting of the semiconductor device propagates along wiring interlayer films as shown by the arrow 60 or 61.

Accordingly, the reason why the portion of the metal line 2b of the fourth embodiment has an effect of preventing propagation of cracks in the wiring interlayer films is the same as that described in the first embodiment or the second embodiment.

On the other hand, the metal line 4 or 7 of the fourth embodiment has an effect of reducing the number of cracks propagating from the scribe region 8b. Although the metal line 4 or 7 is not provided in all the wiring interlayer films, in the wiring interlayer films including the wirings 51a to 51g constituting the metal line 4 or 7, the metal line 4 or 7 has an effect of preventing propagation of cracks. This is because the metal line 4 or 7 has the same effect as that of the metal line 2b. Furthermore, when cracks propagate through the wiring interlayer films disposed between the wirings 51a to 51g constituting the metal line 4 or 7, the metal line 4 or 7 has an effect of limiting the dimension of the cracks. This is because the wirings 51a to 51g reinforce the wiring interlayer films.

Accordingly, the metal line 2b and the metal line 4 or 7 of the fourth embodiment has an effect of more strongly and reliably preventing propagation of cracks in the wiring interlayer films.

Thus, the semiconductor device of the fourth embodiment is a semiconductor device having a crack-propagation-preventing structure composed of the metal line 2b, the metal line 4 or 7, and the opening 2a.

As described above, the metal line 2b and the metal line 4 or 7 of the fourth embodiment can also be easily formed by the same steps as those of forming a semiconductor element and wirings in the element region 8a.

Fifth Embodiment

A semiconductor device of a fifth embodiment and modifications thereof will now be described with reference to FIGS. 13, 14, and 15. In the semiconductor device of the fifth embodiment, a metal line 5 is further provided between a metal line 2b and a moisture-resistant frame-shaped shield 3.

Figure 13:
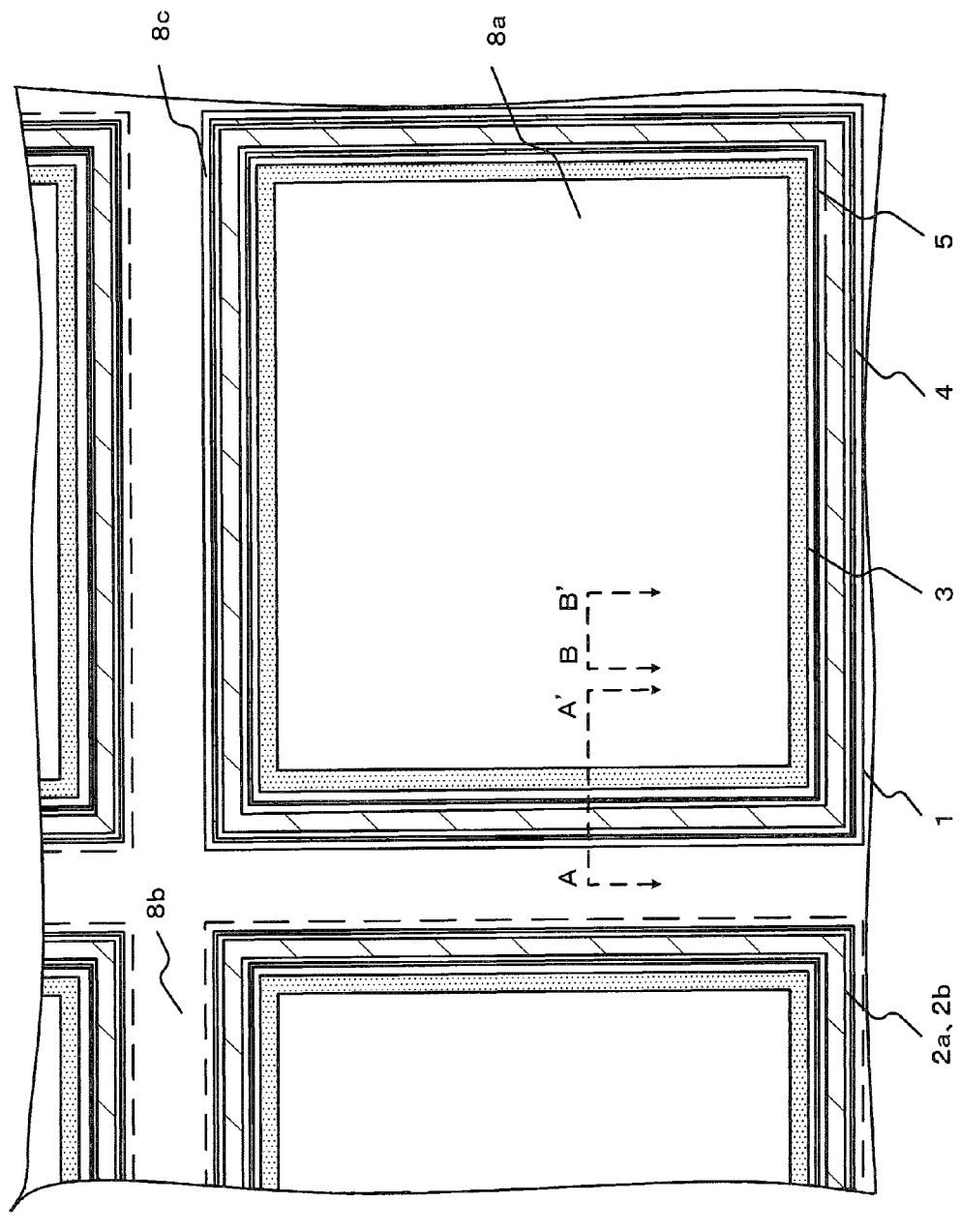
FIG. 13 is a plan view showing a semiconductor device of a fifth embodiment.

FIG. 13 is a plan view showing the semiconductor device according to the fifth embodiment. FIG. 13 shows a scribe edge 1, an opening 2a, a metal line 2b, a moisture-resistant frame-shaped shield 3, a metal line 4, a metal line 5, the element region 8a, the scribe region 8b, and an outer peripheral region 8c. The same components as those shown in FIG. 1, FIG. 2, or FIG. 9 are assigned the same reference numerals.

Accordingly, the description and the arrangement of the scribe edge 1, the opening 2a, the metal line 2b, the moisture-resistant frame-shaped shield 3, the metal line 4, the element region 8a, the scribe region 8b, and the outer peripheral region 8c are the same as the description and the arrangement in FIG. 1, FIG. 2, or FIG. 9.

The metal line 5 is disposed between the opening 2a and the metal line 2b provided thereunder and the moisture-resistant frame-shaped shield 3 in plan view so as to surround the element region 8a. The metal line 5 is composed of a metal wiring having a certain width and forms a continuous frame. As described below, the metal line 5 is composed of a metal material embedded in grooves in a plurality of wiring interlayer films. That is, each of the grooves also has a continuous frame shape.

Figure 14:
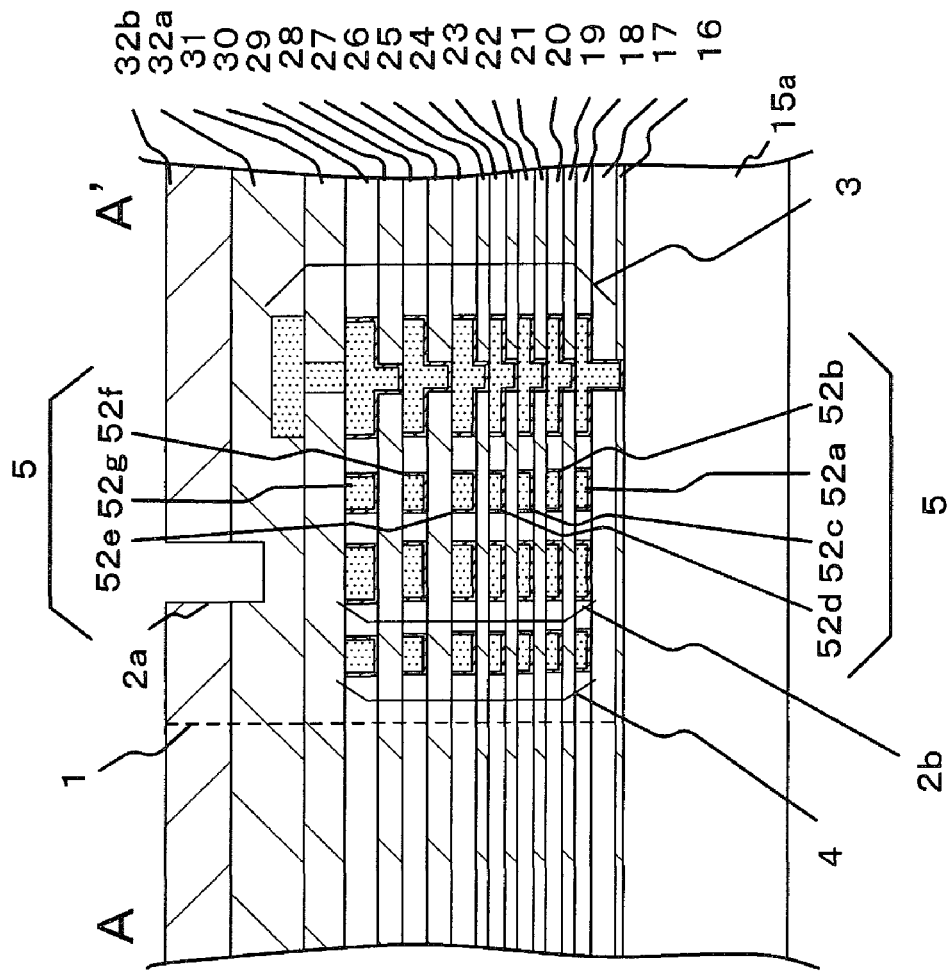
FIG. 14 is a cross-sectional view showing an example of an A-A' cross-sectional structure of the semiconductor device of the fifth embodiment.

FIG. 14 is a cross-sectional view showing an example of an A-A' cross-sectional structure of the semiconductor device of the fifth embodiment. FIG. 14 shows a scribe edge 1, an opening 2a, the metal line 2b, the moisture-resistant frame-shaped shield 3, a metal line 4, a metal line 5, an insulating film 16, a contact interlayer film 17, a contact interlayer film 18, wiring interlayer films 19, 20, 21, 22, 23, 24, 25, 26, 27, 28, 29, 30, and 31, and cover films 32a and 32b.

The same components as those shown in FIGS. 1, 2, 3A, 3B, 5A, 5B, 5C, 6, and 11 are assigned the same reference numerals. Accordingly, the structures of the wirings 45a, 45b, 45c, 45d, 45e, 45f, and 45g constituting the metal line 2b are the same as those shown in FIG. 3A. The structures of the wirings 51a, 51b, 51c, 51d, 51e, 51f, and 51g constituting the metal line 4 are also the same as those shown in FIG. 11.

The cross-sectional view shown by FIG. 14 differs from the cross-sectional view showing the A-A' cross section of the semiconductor device of the fourth embodiment shown by FIG. 11 in that the metal line 5 is further provided.

The metal line 5 shown in FIG. 14 is composed of wirings 52a, 52b, 52c, 52d, 52e, 52f, and 52g.

The wirings constituting the metal line 5 do not include a wiring disposed at a position corresponding to the plug 46h and the wiring 46i forming the moisture-resistant frame-shaped shield 3. This is because it is necessary to ensure a certain amount of the depth of a groove of the opening 2a. The wirings 52a, 52b, 52c, 52d, 52e, 52f, and 52g are disposed between the metal line 2b and the moisture-resistant frame-shaped shield 3.

Each of the wirings 52a, 52b, 52c, 52d, 52e, 52f, and 52g preferably has the same width as that of each of the wirings constituting the metal line 2b. However, the width of the wirings 52a to 52g is not particularly limited as long as the wirings 52a to 52g are not in contact with the metal line 2b and the moisture-resistant frame-shaped shield 3.

The wiring 52a is composed of a wiring embedded in a groove in the contact interlayer film 18. This wiring 52a is made of copper covered with tantalum or tantalum nitride. Tantalum or tantalum nitride functions as a diffusion-preventing film that prevents copper from diffusing in the contact interlayer film 18. The wiring 52a is formed together with the wiring portion of the wiring-and-plug 33 in the element region 8a by a damascene process.

The wiring 52b is composed of a wiring embedded in a groove in the wiring interlayer film 20. The wiring 52b is formed together with the wiring portion of the wiring-and-plug 34 in the element region 8a by a damascene process as in the above-mentioned wiring.

The wiring 52c is composed of a wiring embedded in a groove in the wiring interlayer film 22. The wiring 52c is formed together with the wiring portion of the wiring-and-plug 35 in the element region 8a by a damascene process as in the above-mentioned wiring.

The wiring 52d is composed of a wiring embedded in a groove in the wiring interlayer film 24. The wiring 52d is formed together with the wiring portion of the wiring-and-plug 36 in the element region 8a by a damascene process as in the above-mentioned wiring.

The wiring 52e is composed of a wiring embedded in a groove in the wiring interlayer film 26. The wiring 52e is formed together with the wiring portion of the wiring-and-plug 37 in the element region 8a by a damascene process as in the above-mentioned wiring.

The wiring 52f is composed of a wiring embedded in a groove in the wiring interlayer film 28. The wiring 52f is formed together with the wiring portion of the wiring-and-plug 38 in the element region 8a by a damascene process as in the above-mentioned wiring.

The wiring 52g is composed of a wiring embedded in a groove in the wiring interlayer film 30. The wiring 52g is formed together with the wiring portion of the wiring-and-plug 39 in the element region 8a by a damascene process as in the above-mentioned wiring.

Referring to FIG. 3A, it is believed that, in the scribe region 8b, a crack formed in the scribe edge 1 during cutting of the semiconductor device propagates along wiring interlayer films as shown by the arrow 60 or 61.

Accordingly, the reason why the portion of the metal line 2b of the fifth embodiment has an effect of preventing propagation of cracks in the wiring interlayer films is the same as that described in the first embodiment or the second embodiment.

In addition, the metal line 4 of the fifth embodiment has an effect of decreasing the number of cracks propagating from the scribe region 8b. The reason for this is the same as that described in the fourth embodiment.

Referring to FIG. 3A again, the present inventor has found that a crack formed at an edge of the opening 2a propagates in the direction shown by the arrow 62. However, the crack may propagate in the direction shown by the arrow 63 in some cases.

Consequently, it is believed that, when the wirings 52a to 52g constituting the metal line 5 of the fifth embodiment are provided, even in the case where a crack propagates in the direction shown by the arrow 63, propagation of the crack can be prevented.

This is because since the wirings 52a to 52g constituting the metal line 5 are embedded in the grooves of wiring interlayer films, propagation of a crack in the wiring interlayer films can be prevented. More specifically, the wirings 52a to 52g, which are made of a metal material, have elasticity. Accordingly, when stress due to propagation of a crack is applied to the metal material, the metal material undergoes elastic deformation, thereby releasing the stress. Furthermore, since the wirings 52a to 52g are made of a metal material and have elasticity, it is believed that a large stress is required for breaking the wirings 52a to 52g.

Accordingly, the metal line 2b, the metal line 4, and the metal line 5 of the fifth embodiment has an effect of more strongly preventing propagation of cracks in the wiring interlayer films.

Thus, the semiconductor device of the fifth embodiment is a semiconductor device having a crack-propagation-preventing structure composed of the metal line 2b, the metal line 4, the metal line 5, and the opening 2a.

As described above, the metal line 2b, the metal line 4, and the metal line 5 of the fifth embodiment can also be easily formed by the same steps as those of forming a semiconductor element and wirings in the element region 8a.

Figure 15:
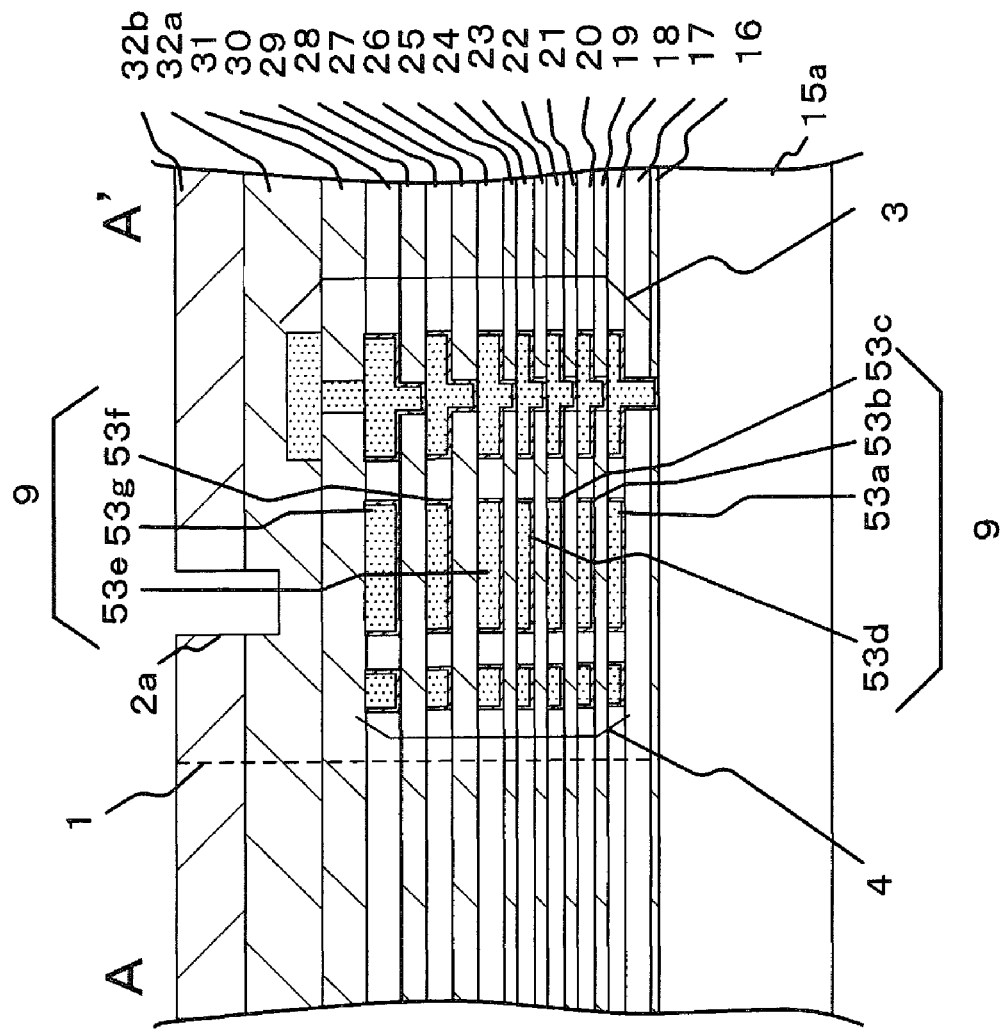
FIG. 15 is a cross-sectional view showing an A-A' cross-sectional structure of a modification 1 of the semiconductor device of the fifth embodiment.

FIG. 15 is a cross-sectional view showing an A-A' cross-sectional structure of a modification 1 of the semiconductor device of the fifth embodiment. FIG. 15 shows a scribe edge 1, an opening 2a, a metal line 9, a moisture-resistant frame-shaped shield 3, a metal line 4, an insulating film 16, a contact interlayer film 17, a contact interlayer film 18, wiring interlayer films 19, 20, 21, 22, 23, 24, 25, 26, 27, 28, 29, 30, and 31, and cover films 32a and 32b.

The same components as those shown in FIGS. 1, 2, 3A, 3B, 5A, 5B, 5C, 6, 11, and 14 are assigned the same reference numerals. Accordingly, the structures of the wirings 51a, 51b, 51c, 51d, 51e, 51f, and 51g constituting the metal line 4 are the same as those shown in FIG. 11. The structures of the wirings 51a, 51b, 51c, 51d, 51e, 51f, and 51g constituting the metal line 4 are also the same as those shown in FIG. 11.

The cross-sectional view shown by FIG. 15 differs from the cross-sectional view showing the A-A' cross section of the semiconductor device of the fifth embodiment shown by FIG. 11 in that the metal line 2b and the metal line 5 are integrated to form a metal line 9.

The metal line 9 shown in FIG. 15 is composed of wirings 53a, 53b, 53c, 53d, 53e, 53f, and 53g.

The wirings constituting the metal line 9 do not include a wiring disposed at a position corresponding to the plug 46h and the wiring 46i forming the moisture-resistant frame-shaped shield 3. This is because it is necessary to ensure a certain amount of the depth of a groove of the opening 2a. The wirings 53a, 53b, 53c, 53d, 53e, 53f, and 53g are disposed between the metal line 4 and the moisture-resistant frame-shaped shield 3.

The wirings 53a, 53b, 53c, 53d, 53e, 53f, and 53g are metal wirings each having a width that two-dimensionally extends from a position overlapping with the opening 2a to the metal line 5 shown in FIG. 14. The wirings 53a, 53b, 53c, 53d, 53e, 53f, and 53g may two-dimensionally extend from a position below the opening 2a to a position where the wirings 53a to 53g are not in contact with the moisture-resistant frame-shaped shield 3.

Referring to FIG. 3A, it is believed that a crack formed in the scribe edge 1 during cutting of the semiconductor device propagates along wiring interlayer films as shown by the arrow 60 or 61.

The reason why the metal line 4 of the fifth embodiment has an effect of reducing the number of cracks propagating from the scribe region 8b is the same that described in the fourth embodiment.

Referring to FIG. 3A again, the present inventor has found that a crack formed at an edge of the opening 2a propagates in the direction shown by the arrow 62. However, the crack may propagate in the direction shown by the arrow 63 in some cases.

Consequently, it is believed that, when the wirings 53a to 53g constituting the metal line 9 of the modification 1 of the fifth embodiment are provided, even in the case where a crack propagates in the direction shown by the arrow 63, propagation of the crack can be prevented.

This is because since the wirings 53a to 53g constituting the metal line 9 are provided in the grooves of wiring interlayer films, propagation of a crack in the wiring interlayer films can be prevented. Furthermore, since the wirings 53a to 53g are made of a metal material and have elasticity, it is believed that a large stress is required for breaking the wirings 53a to 53g.

Accordingly, the metal line 4 and the metal line 9 of the modification 1 of the fifth embodiment has an effect of more strongly preventing propagation of cracks in the wiring interlayer films.

Thus, the modification 1 of the semiconductor device of the fifth embodiment is a semiconductor device having a crack-propagation-preventing structure composed of the metal line 4, the metal line 9, and the opening 2a.

As described above, the metal line 4 and the metal line 9 of the modification 1 of the fifth embodiment can also be easily formed by the same steps as those of forming a semiconductor element and wirings in the element region 8a.

A modification 2 of the semiconductor device of the fifth embodiment will now be described. The modification 2 of the semiconductor device of the fifth embodiment is an example in which the metal line 4 and the metal line 9 in FIG. 15 are formed as an integrated metal line. More specifically, the modification 2 of the semiconductor device of the fifth embodiment is an example in which each of the wirings 51a to 51g constituting the metal line 4 and each of the wirings 53a to 53g constituting the metal line 9 are integrally formed.

That is, the integrated metal line, which is formed so that the metal line 4 and the metal line 9 are integrated with each other, is disposed between the scribe edge 1 and the moisture-resistant frame-shaped shield 3. The width of the integrated metal line is not particularly limited as long as the integrated metal line is disposed between the scribe edge 1 and the moisture-resistant frame-shaped shield 3.

As described above, the metal line 4 and the metal line 9 of the modification 2 of the fifth embodiment can also be easily formed by the same steps as those of forming a semiconductor element and wirings in the element region 8a.

In the case where the metal line 4 and the metal line 9 are further integrally formed in FIG. 15, the effect of preventing propagation of cracks due to the presence of the metal line 4, which has been described in the fourth embodiment, is added to the effect of preventing propagation of cracks due to the presence of the metal line 9.

Sixth Embodiment

In the semiconductor devices described in the first embodiment to the fifth embodiment, patterns except for the metal line 4, which is disposed in the scribe region 8b located between an opening 2a provided in cover films 32a and 32b of a target semiconductor device and an opening 2a of another semiconductor device adjacent to the target semiconductor device, are not considered from the standpoint of formation of cracks. However, when process check monitor (PCM) patterns are provided in the scribe region 8b, cracks can be intensively formed near the PCM patterns. In view of this problem, a semiconductor device of a sixth embodiment includes patterns that are arranged so as to prevent propagation of cracks with paying attention to the presence of PCM patterns.

Figure 16:
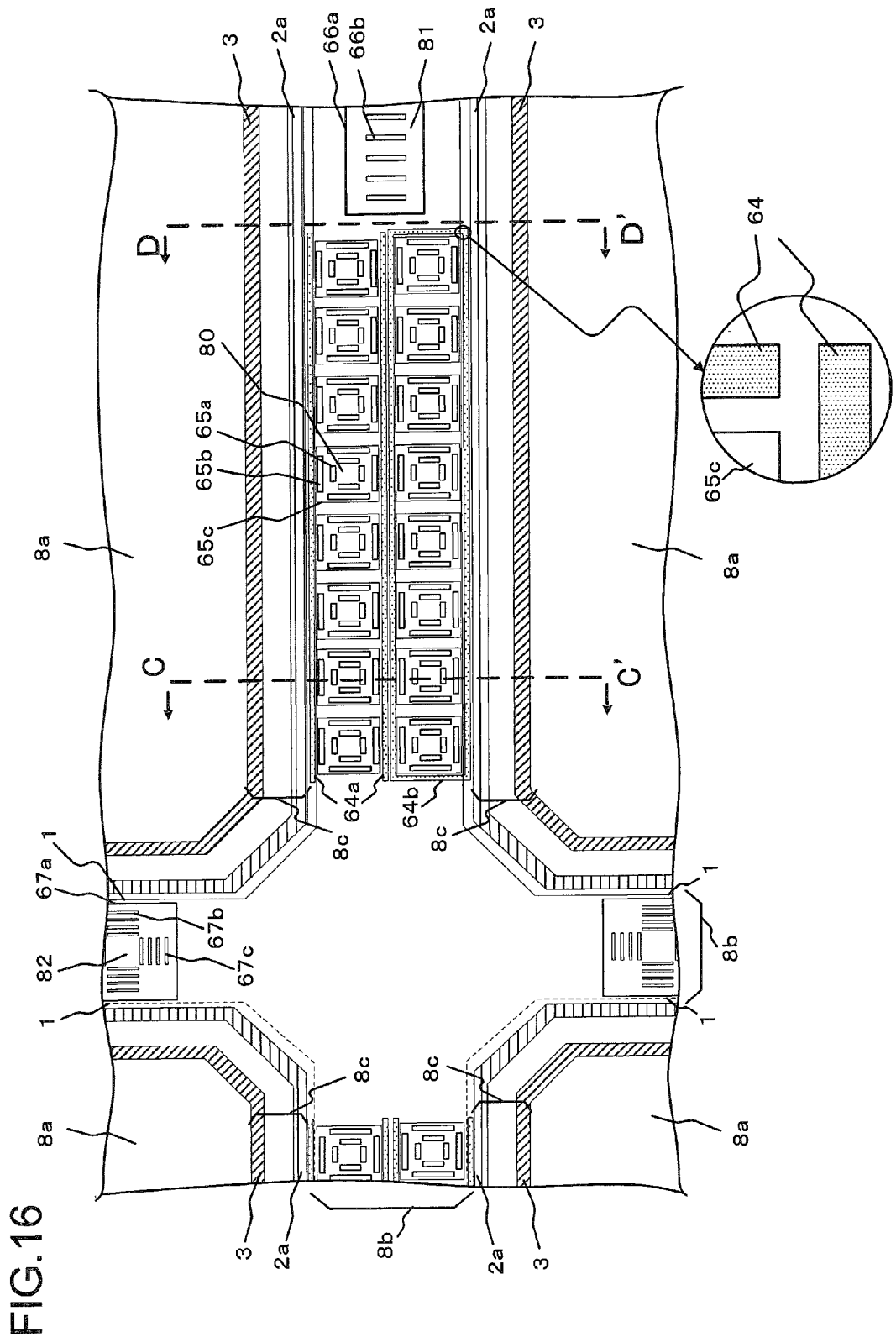
FIG. 16 is a plan view of a portion where scribe regions 8b intersect each other in the case where semiconductor devices of a sixth embodiment are arranged in a matrix shape.

A sixth embodiment will now be described with reference to FIG. 16. FIG. 16 is a plan view of a portion where scribe regions 8b intersect each other in the case where semiconductor devices of the sixth embodiment are arranged in a matrix shape. In FIG. 16, PCM patterns 80, a PCM pattern 81, a metal line 64a, and a metal line 64b are arranged in a scribe region 8b that is disposed between semiconductor devices and that extends in the horizontal direction. In addition, in FIG. 16, PCM patterns 82 are arranged in a scribe region 8b that is disposed between semiconductor devices and that extends in the vertical direction. Furthermore, a moisture-resistant frame-shaped shield 3 and an opening 2a are arranged in an outer peripheral region 8c. Each of the semiconductor devices of the sixth embodiment includes an element region 8a and an outer peripheral region 8c. The scribe region 8b is an area located between scribe edges 1. Note that a metal line 2b is not arranged in the outer peripheral region 8c.

The element region 8a, the scribe region 8b, the outer peripheral region 8c, the opening 2a, and the moisture-resistant frame-shaped shield 3 are the same as those described in the first embodiment. Therefore, a description of these components is omitted.

Each of the PCM patterns 80, 81, and 82 is composed of two or more patterns that are simultaneously formed with two or more patterns among patterns constituting an element provided in the element region 8a. These PCM patterns 80, 81, and 82 are patterns used for checking the state of positional alignment of patterns constituting the element. Each of the PCM patterns 80, 81, and 82 involves a forbidden region where other patterns cannot be arranged, the forbidden region being located within a predetermined distance from the PCM patterns 80, 81, and 82. The reason for this is as follows. When the state of positional alignment of patterns is checked with a laser beam using the PCM patterns 80, 81, and 82, if other patterns are arranged, laser beam light reflected from the other patterns and laser beam light reflected from the patterns constituting the PCM patterns 80, 81, and 82 may interfere with each other. In such a case, the state of positional alignment of patterns constituting the PCM patterns 80, 81, and 82 cannot be accurately detected.

Each of the PCM patterns 80 is composed of four long rectangular patterns 65a, four long rectangular patterns 65b, and a rectangular pattern 65c. The four long rectangular patterns 65a are arranged inside the rectangular pattern 65c in the form of a rectangle so as to be disposed at the center of the rectangular pattern 65c. Each of the rectangular patterns 65a constitutes each side of the rectangle. The four long rectangular patterns 65b are arranged inside the rectangular pattern 65c in the form of a rectangle so as to be disposed around the center of the rectangular pattern 65c. Each of the rectangular patterns 65b constitutes each side of the rectangle. The rectangle formed by the rectangular patterns 65a is smaller than the rectangle formed by the rectangular patterns 65b and is arranged inside the rectangle formed by the rectangular patterns 65b.

The PCM patterns 80 are arranged in the scribe region 8b as a unit composed of two rows and eight columns along the side of the scribe region 8b disposed in the horizontal direction of FIG. 16. The width of the unit of the PCM pattern 80 in the column direction is, for example, about 90% of the width of the scribe region 8b. Accordingly, when the semiconductor devices are cut in the scribe region 8b, a cutting blade is brought into contact with the rectangular patterns 65a, 65b, and 65c and the PCM patterns 80 are broken, thus forming cracks. In this case, the positions where the cracks are formed are close to the moisture-resistant frame-shaped shield 3.

The PCM pattern 81 is composed of a rectangular pattern 66a and a plurality of rectangular patterns 66b. The rectangular pattern 66a is a pattern surrounded by short sides and long sides. The rectangular patterns 66b are long patterns. The rectangular patterns 66b are included in the rectangular pattern 66a and arranged at predetermined intervals so as to be parallel with the short sides of the rectangular pattern 66a. The PCM pattern 81 is arranged in the scribe region 8b along the side of the scribe region 8b disposed in the horizontal direction of FIG. 16. The width of the PCM pattern 81 is, for example, about 70% of the width of the scribe region 8b. Accordingly, when the semiconductor devices are cut in the scribe region 8b, a cutting blade is brought into contact with the rectangular patterns 66a and 66b and the PCM pattern 81 is broken, thus forming cracks. In this case, the positions where the cracks are formed are distant from the moisture-resistant frame-shaped shield 3.

Each of the PCM patterns 82 is composed of a rectangular pattern 67a, a plurality of rectangular patterns 67b, and a plurality of rectangular patterns 67c. The rectangular pattern 67a is a square pattern. The rectangular patterns 67b are long patterns and arranged at predetermined intervals so as to sandwich the center of the rectangular pattern 67a and to be parallel with the right side and the left side of the rectangular pattern 67a. The rectangular patterns 67c are long patterns and arranged at predetermined intervals so as to sandwich the center of the rectangular pattern 67a and to be parallel with the upper side and the lower side of the rectangular pattern 67a. Each of the PCM patterns 82 are arranged in the scribe region 8b along the side of the scribe region 8b disposed in the vertical direction of FIG. 16. The width of the PCM pattern 82 is, for example, about 80% of the width of the scribe region 8b. Accordingly, when the semiconductor devices are cut in the scribe region 8b, a cutting blade is brought into contact with the rectangular patterns 67a, 67b, and 67c and the PCM patterns 82 are broken, thus forming cracks. In this case, the positions where the cracks are formed are distant from the moisture-resistant frame-shaped shield 3, compared with the positions where the cracks are formed in the case of the PCM patterns 80.

The metal line 64a is composed of two long rectangular patterns disposed at both sides of the PCM patterns 80 along one row, i.e., along eight PCM patterns 80, in the unit of the PCM patterns 80. A part of the metal line 64a disposed between the moisture-resistant frame-shaped shield 3 and the PCM patterns 80 belongs to the outer peripheral region 8c. Specifically, the metal line 64a does not include patterns arranged in the column direction of the PCM patterns 80. The metal line 64a is arranged in areas other than the forbidden region of the PCM patterns 80.

The metal line 64a can prevent propagation of a crack formed when the PCM patterns 80 are broken immediately after the formation of the crack. This is because the propagation of the crack is blocked by metal patterns constituting the metal line 64a. The metal patterns will be described below in detail with reference to FIGS. 17A and 17B. The metal patterns have elasticity. Therefore, when stress due to the propagation of a crack is applied to the metal patterns, the metal patterns undergo elastic deformation, thereby releasing the stress.

The metal line 64b is a strip-shaped pattern with a small width that surrounds one row, i.e., eight PCM patterns 80, in the unit of the PCM patterns 80 so as to form a rectangle. A part of the metal line 64b disposed between the moisture-resistant frame-shaped shield 3 and the PCM patterns 80 belongs to the outer peripheral region 8c. The metal line 64b is arranged in areas other than the forbidden region of the PCM patterns 80.

As shown in the enlarged view in FIG. 16, the metal line 64b has a discontinuous shape at corners of the metal line 64b, and a space is provided between two adjacent patterns of the metal line 64b. The reason for this is as follows. The pattern constituting the metal line 64b is fine. Therefore, if such a space is not provided at a corner of the metal line 64b, a rounded portion is formed at the corner of the metal line 64b because of a property of a photolithographic method which is employed for forming the metal line 64b. As a result, the corner portion of the metal line 64b is disposed in a forbidden region of the PCM patterns 80. In this case, a function of detecting the positional alignment of the PCM patterns 80 is degraded.

The metal line 64b can prevent propagation of a crack formed when the PCM patterns 80 are broken immediately after the formation of the crack as in the metal line 64a.

In FIG. 16, the metal line 64a is arranged for the upper row of the unit of the PCM patterns 80, and the metal line 64b is arranged for the lower row thereof. Alternatively, metal lines 64a may be arranged for the upper row and the lower row of the unit of the PCM patterns 80. Alternatively, metal lines 64*b* may be arranged for the upper row and the lower row of the unit of the PCM patterns 80.

Accordingly, a part of the metal line 64*a* or a part of the metal line 64*b* having a length corresponding to one row of the PCM patterns 80 is arranged between the opening 2*a* and the PCM patterns 80, i.e., in the outer peripheral region 8*c*.

A cross section taken along line C-C' in FIG. 16 and a cross section taken along line D-D' in FIG. 16 will now be described with reference to FIGS. 17A and 17B.

FIG. 17A is a view showing a cross section taken along line C-C' in FIG. 16.

Referring to FIG. 17A, interlayer insulating films including an insulating film 16, contact interlayer films 17 and 18, wiring interlayer films 19, 20, 21, 22, 23, 24, 25, 26, 27, 28, 29, 30, and 31, and cover films 32*a* and 32*b* are provided on a substrate 15*a*.

Referring to FIG. 17A, moisture-resistant frame-shaped shields 3 composed of wiring-and-plugs 46*a*, 46*b*, 46*c*, 46*d*, 46*e*, 46*f*, and 46*g*, a plug 46*h*, a wiring 46*i*, all of which are provided in the interlayer insulating films, are provided in outer peripheral regions 8*c* each located between an opening 2*a* and an element region 8*a*.

Referring to FIG. 17A, a part of metal patterns constituting the metal line 64*a* and a part of metal patterns constituting the metal line 64*b* are disposed not right under the openings 2*a* but in the outer peripheral regions 8*c*. Furthermore, other parts of the metal patterns constituting the metal line 64*a*, other parts of the metal patterns constituting the metal line 64*b*, and the rectangular patterns 65*a*, 65*b*, and 65*c* constituting the PCM patterns 80 are arranged in the scribe region 8*b*.

The metal patterns constituting the metal line 64*a* and the metal patterns constituting the metal line 64*b* are formed together with the wiring-and-plugs 46*a*, 46*b*, 46*c*, 46*d*, 46*e*, 46*f*, and 46*g*. In addition, the above metal patterns are formed as wirings by a damascene process. Each of the metal patterns may include a plug portion of the wiring-and-plug 46*a* or the like. In such a case, the metal patterns are formed by a dual damascene process, and the metal patterns formed in the interlayer insulating films are closely in contact with each other via the plug portions. It is believed that when the metal patterns have the same structure as that of the wiring-and-plug 46*a* and the like, a high effect of preventing propagation of cracks can be achieved because the adhesiveness between the metal patterns and the interlayer insulating films is high.

The rectangular patterns 65*c* of the PCM patterns 80 are made of the same material as a gate electrode 13. The rectangular patterns 65*c* and the gate electrode 13 are simultaneously formed by the same method as a method of forming the gate electrode 13. The rectangular patterns 65*a* are opening patterns provided inside each of the rectangular patterns 65*c*. Accordingly, the rectangular patterns 65*a* and the gate electrode 13 are also simultaneously formed by the same method as the method of forming the gate electrode 13. The rectangular patterns 65*b* and an STI 10 are simultaneously formed by the same method as a method of forming the STI 10. That is, the rectangular patterns 65*b* are recognized as opening patterns provided in the substrate 15*a*.

FIG. 17B is a view showing a cross section taken along line D-D' in FIG. 16.

Referring to FIG. 17B, the interlayer insulating films composed of the insulating film 16, the contact interlayer films 17 and 18, the wiring interlayer films 19, 20, 21, 22, 23, 24, 25, 26, 27, 28, 29, 30, and 31, and the cover films 32*a* and 32*b* are provided on the substrate 15*a*.

Referring to FIG. 17B, the moisture-resistant frame-shaped shields 3 composed of the wiring-and-plugs 46*a*, 46*b*, 46*c*, 46*d*, 46*e*, 46*f*, and 46*g*, the plug 46*h*, the wiring 46*i*, all of which are provided in the interlayer films, are provided in the outer peripheral regions 8*c* each located between an opening 2*a* and an element region 8*a*.

However, no patterns are provided in the scribe region 8*b*. Specifically, since the PCM patterns 80 are not present, when the semiconductor devices are cut in the scribe region 8*b* with a cutting blade, cracks are formed at positions distant from the moisture-resistant shield frames 3 or the openings 2*a*. Accordingly, a possibility that propagation of cracks reaches the moisture-resistant shield frames 3 or the openings 2*a* is low. Therefore, the metal line 64*a* or the metal line 64*b* may not be provided.

As described above, the metal line 64*a* and the metal line 64*b* are arranged in the outer peripheral region 8*c* of the semiconductor device of the sixth embodiment so as to be adjacent to the PCM patterns 80. However, unlike the semiconductor devices of the first embodiment to the fifth embodiment, a metal line 2*b* surrounding the element region 8*a* is not arranged right under the opening 2*a*.

This structure cannot improve an effect of preventing propagation of cracks over the entire outer peripheral region 8*c*. However, by the presence of the metal patterns constituting the metal line 64*a* or 64*b*, propagation of cracks can be effectively prevented in areas where cracks are formed with a particularly high probability. This is because the effect of preventing propagation of cracks due to the presence of the metal patterns constituting the metal line 64*a* or 64*b* is the same as that due to the presence of the metal line 2*b* described in the first embodiment to the fifth embodiment.

Alternatively, the metal line 64*a* or 64*b* can be used in combination with the metal line 2*b* described in the first embodiment to the fifth embodiment. Such a structure can more strongly prevent propagation of cracks formed by the presence of the PCM patterns 80.

In the above-described embodiment, the metal line 64*a* or 64*b* is arranged for the PCM patterns. Alternatively, the metal line 64*a* or 64*b* may be arranged for a pattern that is provided in the scribe region in order to monitor electrical characteristics of elements.

Seventh Embodiment

In the sixth embodiment, the metal line 64*a* or the metal line 64*b* is composed of isolated metal patterns. In this case, when a metal material is embedded in the interlayer insulating films to form the metal patterns by a damascene process, dishing or erosion during a step of CMP occurs. As a result, a formation failure of the metal patterns may occur. Accordingly, in a seventh embodiment, a pattern for preventing the occurrence of dishing or erosion during a step of CMP is provided so as to be adjacent to the above-mentioned metal patterns.

Figure 18:
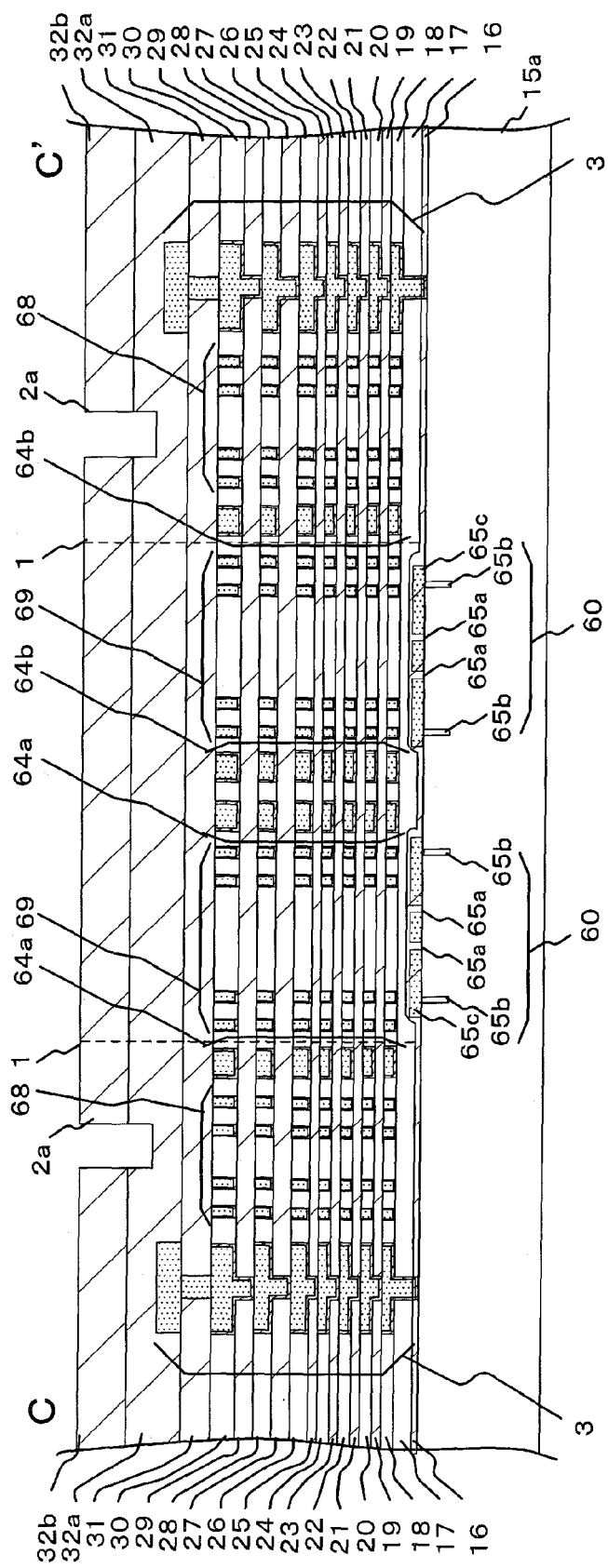
FIG. 18 is a view showing a cross section taken along line C-C' in FIG. 16 in a seventh embodiment.

The seventh embodiment will now be described with reference to FIG. 18. FIG. 18 is a view showing a cross section taken along line C-C' in FIG. 16 in the seventh embodiment.

Referring to FIG. 18, interlayer insulating films composed of an insulating film 16, contact interlayer films 17 and 18, wiring interlayer films 19, 20, 21, 22, 23, 24, 25, 26, 27, 28, 29, 30, and 31, and cover films 32*a* and 32*b* are provided on a substrate 15*a*.

Referring to FIG. 18, moisture-resistant frame-shaped shields 3 composed of wiring-and-plugs 46*a*, 46*b*, 46*c*, 46*d*, 46*e*, 46*f*, and 46*g*, a plug 46*h*, a wiring 46*i*, all of which are provided in the interlayer films, are provided in outer peripheral regions 8*c* each located between an opening 2*a* and an element region 8*a*.

Referring to FIG. 18, a part of metal patterns constituting a metal line 64a and a part of metal patterns constituting a metal line 64b are arranged not right under the openings 2a but in the outer peripheral regions 8c. Furthermore, other parts of the metal patterns constituting the metal line 64a, other parts of the metal patterns constituting the metal line 64b, and rectangular patterns 65a, 65b, and 65c constituting PCM patterns 80 are arranged in a scribe region 8b.

Referring to FIG. 18, dummy patterns 68 and 69 are arranged so as to be adjacent to the metal line 64a or the metal line 64b in the outer peripheral regions 8c and the scribe region 8b.

In the above semiconductor device, the metal lines 64a and 64b; the substrate 15a; the interlayer insulating films composed of the insulating film 16, the contact interlayer films 17 and 18, the wiring interlayer films 19, 20, 21, 22, 23, 24, 25, 26, 27, 28, 29, 30, and 31, and cover films 32a and 32b; the moisture-resistant frame-shaped shield 3 composed of the wiring-and-plugs 46a, 46b, 46c, 46d, 46e, 46f, and 46g, the plug 46h, and the wiring 46i; the opening 2a; the element region 8a; the scribe region 8b; the outer peripheral region 8c; and the scribe edge 1 are the same as those in the above-described embodiments.

The dummy pattern 68 include metal patterns provided in the contact interlayer film 18, the wiring interlayer films 20, 22, 24, 26, 28, and 30. The dummy pattern 68 is disposed between the moisture-resistant frame-shaped shield 3 and the metal line 64a or 64b. The dummy pattern 68 is formed by a damascene process as in the above-described metal patterns constituting the metal line 64a or 64b in the wiring interlayer films. In this structure, a pattern formation failure caused by dishing or erosion during a step of CMP in the damascene process can be prevented.

The dummy pattern 69 include metal patterns provided in the contact interlayer film 18, the wiring interlayer films 20, 22, 24, 26, 28, and 30. The dummy pattern 69 is disposed on the PCM patterns 80 between the metal line 64a and the metal line 64a or between the metal line 64b and the metal line 64b. The dummy pattern 69 is formed by a damascene process as in the above-described metal patterns constituting the metal line 64a or 64b in the wiring interlayer films. In this structure, a pattern formation failure caused by dishing or erosion during a step of CMP in the damascene process can be prevented.

The term "dishing" refers to a phenomenon in which a metal pattern having a large width becomes concave so as to have a shallow dish shape. The term "erosion" refers to a phenomenon in which the thickness of an insulating film disposed in an area where fine metal patterns are densely arranged decreases together with the thickness of the metal patterns, as compared with that in an area where wiring patterns are not formed.

Accordingly, in the case where the dummy patterns 68 and 69 are arranged at appropriate intervals so as to be adjacent to the metal patterns constituting the metal line 64a or 64b, the grinding of the patterns in the step of CMP does not concentrate only on the metal patterns constituting the metal line 64a or 64b. Therefore, a pattern formation failure can be prevented.

In addition, the semiconductor device of the seventh embodiment also provides the same advantage as that of the semiconductor device of the sixth embodiment. Furthermore, since the dummy pattern 68 is provided between the metal line 64a or 64b and the moisture-resistant frame-shaped shield 3, this semiconductor device is advantageous in that propagation of cracks formed in the scribe region 8b can be more strongly suppressed.

Eighth Embodiment

The planar shape of each of the metal patterns constituting the metal line 64a or 64b of the sixth embodiment and the seventh embodiment is a rectangle. However, unless the adhesiveness between a metal pattern and an interlayer insulating film in which the metal pattern is provided is sufficient, the metal pattern is separated from the interlayer insulating film, and stress in the interlayer insulating film is not transferred to the metal pattern. As a result, stress release due to elastic deformation of metal patterns does not occur, and thus propagation of a crack in interlayer insulating films is not prevented.

Consequently, a metal line of an eighth embodiment has a planar shape having irregularities in order to improve the adhesiveness between the metal patterns and the interlayer insulating films.

Planar shapes of a metal line arranged in a semiconductor device of the eighth embodiment will now be described with reference to FIGS. 19A to 19G. FIGS. 19A to 19F each show a planer shape of a metal pattern forming a metal line 64a or 64b.

FIG. 19A shows a basic metal line 70 for a metal pattern forming the metal line 64a or 64b. The basic metal line 70 is a rectangular pattern. The metal line 64a or 64b is formed by arranging a plurality of basic metal lines 70 at predetermined intervals. In this structure, the contact area between the metal pattern and an interlayer insulating film in which the metal pattern is provided is increased, compared with the case where the metal line 64a or 64b is formed as a single pattern. This is because the perimeter of the metal pattern is increased, and thus, the total area of the side faces of the metal pattern is increased.

FIG. 19B shows a basic metal line 71 for a metal pattern forming the metal line 64a or 64b. In the basic metal line 71, smaller rectangular patterns are arranged in two lines. Accordingly, the contact area between the metal pattern and an interlayer insulating film in which the metal pattern is provided is further increased compared with the case where the metal line 64a or 64b is formed using the basic metal line 70.

FIG. 19C shows a basic metal line 72 for a metal pattern forming the metal line 64a or 64b. In the basic metal line 72, rectangular patterns smaller than the small rectangular patterns forming the basic metal line 71 are arranged in two lines. Accordingly, the contact area between the metal pattern and an interlayer insulating film in which the metal pattern is provided is further increased compared with the case where the metal line 64a or 64b is formed using the basic metal line 71.

FIG. 19D shows a basic metal line 73 for a metal pattern forming the metal line 64a or 64b. The basic metal line 73 is a metal line in which irregularities are provided at the periphery of the basic metal line 70. The perimeter of the basic metal line 73 is increased by providing the irregularities, thus increasing the contact area between the metal pattern and an interlayer insulating film in which the metal pattern is provided.

FIG. 19E shows a basic metal line 74 for a metal pattern forming the metal line 64a or 64b. The basic metal line 74 is a metal line in which irregularities larger than the irregularities of the basic metal line 73 are provided at a side of the basic metal line 70. Since the perimeter of the basic metal line 74 is increased, the contact area between the metal pattern and an interlayer insulating film in which the metal pattern is provided is increased.

FIG. 19F shows a basic metal line 75 for a metal pattern forming the metal line 64a or 64b. In the basic metal line 75, large irregularities having a pattern shape that extends in the horizontal direction are provided at the periphery thereof. Since the perimeter of the basic metal line 75 is increased, the contact area between the metal pattern and an interlayer insulating film in which the metal pattern is provided is increased.

FIG. 19G shows a part of the shape of a mask pattern of a mask used for forming the basic metal line 73, 74, or 75.

When the basic metal line 73, 74, or 75 is formed by photolithography, small irregularities of the basic metal line 73, 74, or 75 cannot be formed in some cases because of the following reason. For example, when the basic metal line 73, 74, or 75 has small irregularities, light is diffracted on a mask pattern provided on a mask by the proximity effect of light. As a result, the mask pattern provided on the mask cannot be accurately transferred on a semiconductor substrate during exposure.

To solve this problem, by providing a recessed portion shown in FIG. 19G at a corner of the mask pattern corresponding to the basic metal line 73, 74, or 75, such small irregularities can be accurately reproduced. This is because the mask pattern is designed in consideration of the diffraction of light.

What is claimed is:

1. A semiconductor device comprising:
    an element region having an element formed on a substrate;
    a moisture-resistant frame surrounding the element region and defining the element region;
    a periphery region being between an outer peripheral edge of the substrate and the moisture-resistant frame;
    an insulating layer provided over the moisture-resistant frame, the element region and the periphery region;
    a first metal line extending over the periphery region and provided in the insulating layer, the first metal line being separate from the moisture-resistant frame;
    a second metal line extending over the periphery region and provided in the insulating layer, the second metal line being disposed between the first metal line and the substrate; and
    a groove-shaped opening without being filled by a wire provided in the insulating layer, the groove-shaped opening being disposed over the first metal line, a bottom of the groove-shaped opening separating apart from the first metal line or reaching the first metal line wherein a position of a side face of the first metal line faced to the moisture-resistant frame accords a position of a side face of the second metal line faced to the moisture-resistant frame.

2. The semiconductor device according to claim 1, wherein the first metal line is arranged so as to surround the element region.

3. The semiconductor device according to claim 1, wherein the first metal line includes irregularities provided at a side defining a planer shape of the first metal line.

4. The semiconductor device according to claim 1, further comprising:
    a third metal line provided in the insulating layer and in a region disposed between the first metal line and the outer peripheral edge.

5. The semiconductor device according to claim 1, wherein the first metal line or the groove-shaped opening has a discontinuous portion.

6. The semiconductor device according to claim 1, wherein a position of a side face of the first metal line at a side of the element region is aligned with a position of a side face of the groove-shaped opening at the side of the element region.

7. The semiconductor device according to claim 1, further comprising:
    a metal wiring having a width larger than the width of the first metal line, the metal wiring being disposed between the first metal line and the groove-shaped opening and under the groove-shaped opening.

8. The semiconductor device according to claim 1, wherein the first metal line comprises a first wiring, a second wiring disposed under the first wiring, and a contact plug connecting to the first wiring to the second wiring.

9. The semiconductor device according to claim 2, wherein a distance between a position of a side face of the first metal line, the side face being disposed at a side of an outer peripheral edge, and the outer peripheral edge is smaller than a distance between the position of a side face of the groove-shaped opening, the side face being disposed at the side of the outer peripheral edge, and the outer peripheral edge.

10. The semiconductor device according to claim 1, further comprising:
    a dummy pattern provided in the insulating layer between the first metal line and the outer peripheral edge.

11. The semiconductor device according to claim 1, wherein the groove-shaped opening is arranged so as to surround the element region.

* * * * *